(12) United States Patent
Seshadri et al.

(10) Patent No.: US 8,791,451 B2
(45) Date of Patent: Jul. 29, 2014

(54) MODIFIED PLANARIZING AGENTS AND DEVICES

(75) Inventors: Venkataramanan Seshadri, Monroeville, PA (US); Christopher T. Brown, Pittsburgh, PA (US); Brian E. Woodworth, Pittsburgh, PA (US); Edward S. Yang, Cheswick, PA (US)

(73) Assignee: Solvay USA, Inc., Houston, TX (US)

( * ) Notice: Subject to any disclaimer, the term of this patent is extended or adjusted under 35 U.S.C. 154(b) by 700 days.

(21) Appl. No.: 12/399,006

(22) Filed: Mar. 5, 2009

(65) Prior Publication Data

US 2009/0230361 A1 Sep. 17, 2009

Related U.S. Application Data

(60) Provisional application No. 61/034,476, filed on Mar. 6, 2008.

(51) Int. Cl.
| | |
|---|---|
| *H01L 51/50* | (2006.01) |
| *H01L 51/54* | (2006.01) |
| *H01L 51/56* | (2006.01) |
| *C08L 25/18* | (2006.01) |
| *C08L 25/00* | (2006.01) |
| *H01L 51/00* | (2006.01) |
| *C08L 35/00* | (2006.01) |
| *C08L 65/00* | (2006.01) |

(52) U.S. Cl.
CPC ............... *H01L 51/004* (2013.01); *C08L 65/00* (2013.01); *Y02E 10/549* (2013.01); *C08L 25/18* (2013.01); *C08L 25/00* (2013.01); *C08L 35/00* (2013.01); *C08G 2261/512* (2013.01); *H01L 51/0036* (2013.01); *H01L 51/5088* (2013.01); *Y10S 362/80* (2013.01)
USPC .............. 257/40; 257/E51.027; 257/E51.033; 257/E51.022; 257/E51.023; 257/E51.026; 257/E51.036; 257/E51.029; 252/182.12; 252/182.13; 252/182.17; 252/182.23; 252/182.24; 252/182.31; 252/582; 252/500; 106/31.13; 362/800

(58) Field of Classification Search
USPC ................. 252/299.2, 182.1, 182.13, 182.17, 252/182.23, 182.24, 182.31, 182.3, 582, 252/500; 362/800; 106/31.13; 257/E25.009, E51.033, E51.018, 257/E51.022, E51.023, E51.026, E51.036, 257/E51.027, E51.029
See application file for complete search history.

(56) References Cited

U.S. PATENT DOCUMENTS

| | | | |
|---|---|---|---|
| 4,737,557 A | 4/1988 | Sato et al. | |
| 4,909,959 A | 3/1990 | Lemaire et al. | |
| 5,047,687 A | 9/1991 | VanSlyke | |
| 5,137,991 A | 8/1992 | Epstein et al. | |
| 5,247,190 A | 9/1993 | Friend et al. | |
| 5,401,827 A | 3/1995 | Holmes et al. | |
| 5,454,880 A | 10/1995 | Sariciftci et al. | |
| 5,548,060 A | 8/1996 | Allcock et al. | |
| 5,993,694 A | 11/1999 | Ito et al. | |
| 6,166,172 A | 12/2000 | McCullough et al. | |
| 6,365,294 B1 | 4/2002 | Pintauro et al. | |
| 6,602,974 B1 | 8/2003 | McCullough et al. | |
| 6,812,399 B2 | 11/2004 | Shaheen et al. | |
| 6,933,436 B2 | 8/2005 | Shaheen et al. | |
| 2003/0195330 A1 | 10/2003 | Lambertus | |
| 2005/0124784 A1 | 6/2005 | Sotzing | |
| 2006/0045959 A1* | 3/2006 | Yasukawa et al. | 427/66 |
| 2007/0123686 A1* | 5/2007 | Mahood et al. | 528/196 |
| 2007/0172702 A1* | 7/2007 | Elschner et al. | 428/690 |
| 2007/0219338 A1 | 9/2007 | Takeda et al. | |

FOREIGN PATENT DOCUMENTS

| | | | |
|---|---|---|---|
| WO | 2006/086480 | * | 8/2006 |
| WO | WO 2006/086480 A | | 8/2006 |

OTHER PUBLICATIONS

U.S. Appl. No. 11/826,394, filed Jul. 13, 2007, Seshadri et al.
U.S. Appl. No. 12/395,327, filed Feb. 27, 2009, Brown et al.
U.S. Appl. No. 61/034,476, filed Mar. 6, 2008, Seshadri et al.
Anthopoulos et al., Applied Physics Letters, (Jun. 30, 2003) 82, 26, p. 4824-4826.
Bredas and Silbey (eds.), Conjugated Polymers, (1991) Kluwer Academic Press, Dordrecht.
Francois et al., *Synth. Met.*, (1995) 69, p. 463-466.
Friend, "Polymer LEDs," *Physics World*, (Nov. 1992) 5, 11, p. 42-46.
Friend et al., "Electroluminescence in Conjugated Polymers," *Handbook of Conducting Polymers*, $2^{nd}$ Ed., p. 823-846 (1998).
Hempenius et al., *J. Am. Chem. Soc.*, (1998) 120, p. 2798-2804.
Jenekhe et al., *Science*, (Mar. 20, 1998) 279, p. 1903-1907.
Katz et al., "Organic Transistor Semiconductors," *Accounts of Chemical Research*, (2001) vol. 34, No. 5, p. 359, 365-367.

(Continued)

*Primary Examiner* — Lorna M Douyon
*Assistant Examiner* — Amina Khan
(74) *Attorney, Agent, or Firm* — The Marbury Law Group, PLLC

(57) ABSTRACT

A composition comprising: at least one conjugated polymer, at least one second polymer comprising repeat units represented by: (I) optionally, —[$CH_2$—CH(Ph-OH)]— and (II) —[$CH_2$—CH(Ph-OR)]— wherein Ph is a phenyl ring and R comprises a fluorinated group, an alkyl group, an alkylsulfonic acid group, an alkylene oxide group, or a combination thereof is described. Other polymers can be used as second polymer including polymers comprising modified naphthol side groups. The composition can be used in hole injection and hole transport layers for organic electronic devices. Increased lifetime and better processability can be achieved. Versatility with useful OLED emitters can be achieved. Ink formulations can be adapted for ink jet printing. The conjugated polymer can be a polythiophene. Applications include OLEDs and OPVs.

30 Claims, 6 Drawing Sheets

(56) References Cited

OTHER PUBLICATIONS

Kraft et al., "Electroluminescent Conjugated Polymers—Seeing Polymers in a New Light," *Agnew. Chem. Int. Ed.*, (1998) 37, p. 402-408.
Lee et al., G.A. Ring Sulfonated poly(thieno[3,4-b]thiophene), *Adv. Mater.*, (2005) 17, 1792.
Li et al., *Macromolecules*, (1999) 32, p. 3034-3044.
McCullough et al., "Regioregular, Head-to-Tail Coupled Poly(3-alkylthiophene) and its Derivatives," *Handbook of Conducting Polymers, $2^{nd}$ Ed.*, p. 225-258 (1998).
McCullough, "The Chemistry of Conducting Polythiophenes," *Adv. Mater.* (1998) 10, No. 2. p. 93-116.
Noshay and McGrath, *Block Polymers, Overview and Critical Survey*, (1977) Academic Press.
Roncali, *Chem. Rev.*, (1992) 92, 711.
Schopf et al., *Polythiophenes: Electrically Conductive Polymers*, (1997) Springer: Berlin.
Wang et al., *J. Am. Chem. Soc.*, (2000) 122, p. 6855-6861.
Widawski et al., *Nature* (London), (Jun. 2, 1994) vol. 369, p. 387-389.
Wiley, The Encyclopedia of Polymer Science and Engineering, pp. 298-300 (1990).
Yang et al., *Macromolecules*, (1993) 26, p. 1188-1190.
PCT/US2009/036249 filed Mar. 5, 2009, Intl. Search Report & Written Opinion dated Jul. 13, 2009 (15 pages).

\* cited by examiner

MODIFIED PLANARIZING AGENTS AND DEVICES

RELATED APPLICATIONS

This application claims priority to U.S. provisional application 61/034,476 filed Mar. 6, 2008, which is hereby incorporated by reference in its entirety.

BACKGROUND

Although useful advances are being made in energy saving devices such as organic-based organic light emitting diodes (OLEDs), polymer light emitting diodes (PLEDs), and organic photovoltaic devices (OPVs), further improvements are still needed in providing better processing and performance. For example, one promising type of material is conducting polymers including for example polythiophenes and regioregular polythiophenes. However, problems can arise with doping, purity, and solubility and processing. In particular, it is important to have very good control over the solubility of alternating layers of polymer (e.g., orthogonal or alternating solubility properties among adjacent layers). In particular, hole injection layers (HILs) and hole transport layers (HTLs) can present difficult problems in view of competing demands and the need for very thin, but high quality, films.

A need exists for a good platform system to control properties of hole injection and transport layers such as solubility and electronic energy levels such as HOMO and LUMO, so that the materials can be adapted for different applications and to function with different materials such as light emitting layers, photoactive layers, and electrodes. In particular, good solubility properties are important, as well as the control of energy levels such as HOMO and LUMO, as well as work function, and the ability to formulate the system for a particular application and provide the required balance of properties.

SUMMARY

Embodiments described herein include, for example, compositions, including monomers and polymers, devices, methods of making, and methods of using.

For example, one embodiment comprises a composition comprising: at least one conjugated polymer, at least one second polymer comprising at least one side group comprising at least one —OR functionality, wherein R comprises a fluorinated group, an alkyl group, an alkylsulfonic acid group, an alkylene oxide group, or a combination thereof.

Another embodiment provides a composition comprising: at least one conjugated polymer, at least one second polymer comprising repeat units represented by: (I) optionally, —[CH$_2$—CH(Ph-OH)]— and (II) —[CH$_2$—CH(Ph-OR)]—, wherein Ph is a phenyl ring and R comprises a fluorinated group, an alkyl group, an alkylsulfonic acid group, an alkylene oxide group, or a combination thereof.

Another embodiment provides a composition comprising: at least one conjugated polymer, at least one second polymer comprising repeat units represented by: (I) optionally, —[CH$_2$—CH(Ph-OH)]— and (II) —[CH$_2$—CH(Ph-OR)]— wherein R increases or decreased contact angle relative to the control polymer, —[CH$_2$—CH-Ph-OH]$_n$—.

Another embodiment provides a composition comprising: at least one conjugated polymer, at least one second polymer comprising repeat units represented by: (I) optionally, —[CH$_2$—CH(Ph-OH)]— and (II) —[CH$_2$—CH(Ph-OR)]— wherein Ph is a phenyl ring and R comprises a fluorinated group.

Another embodiment provides a composition comprising: at least one conjugated polymer, at least one second polymer comprising repeat units represented by: (I) optionally, —[CH$_2$—CH(Ph-OH)]— and (II) —[CH$_2$—CH(Ph-OR)]— wherein Ph is a phenyl ring and R comprises an alkyl group.

Another embodiment provides a composition comprising: at least one conjugated polymer, at least one second polymer comprising repeat units represented by: (I) optionally, —[CH$_2$—CH(Ph-OH)]— and (II) —[CH$_2$—CH(Ph-OR)]— wherein Ph is a phenyl ring and R comprises an alkylsulfonic acid group.

Another embodiment provides a composition comprising: at least one conjugated polymer, at least one second polymer comprising repeat units represented by: (I) optionally, —[CH$_2$—CH(Ph-OH)]— and (II) —[CH$_2$—CH(Ph-OR)]— wherein Ph is a phenyl ring and R comprises an alkylene oxide group.

Another embodiment provides a composition comprising: at least one conjugated polymer, at least one second polymer comprising repeat units represented by: (I) optionally, —[CH$_2$—CH(Ph-OH)]— and (II) —[CH$_2$—CH(Ph-OR)]— wherein Ph is a phenyl ring and R comprises a fluorinated group, an alkyl group, an alkylsulfonic acid group, an alkylene oxide group, or a combination thereof, and at least one solvent carrier, wherein the composition is adapted for use as a hole injection or a hole transport layer.

In one embodiment, R comprises a fluorinated group. In one embodiment, R comprises a perfluorinated group. In one embodiment, R comprises an alkyl group. In one embodiment, R comprises an alkylsulfonic acid group. In one embodiment, R comprises an alkylene oxide group. In one embodiment, R comprises an ethylene oxide group. In one embodiment, the conjugated polymer is a heterocyclic polymer. In one embodiment, the conjugated polymer is a polythiophene. In one embodiment, the conjugated polymer is a regioregular polythiophene. In one embodiment, the weight percentage of the second polymer is more than the weight percentage of the first polymer. In one embodiment, the weight percentage of the second polymer is at least three times as much as the weight percentage of the first polymer. In one embodiment, the weight percentage of the second polymer is at least six times as much as the weight percentage of the first polymer. In one embodiment, the composition further comprises at least one third polymer. In one embodiment, the composition further comprises at least one third polymer which is an ionic polymer. In one embodiment, the composition further comprises at least one third polymer which is an ionic fluorinated polymer. In one embodiment, the composition further comprises at least one third polymer which is present in a weight percentage amount which is less than the weight percentage of the conjugated polymer.

In one embodiment, the composition further comprises a solvent carrier. In one embodiment, the composition further comprises a solvent carrier comprising water and at least one second solvent. In one embodiment, the conjugated polymer and the second polymer are soluble. The polymers can be soluble in a solvent carrier comprising one or more solvents. In one embodiment, the molar amount of repeat unit (I) is greater than the molar amount of repeat unit (II). In one embodiment, the molar amount of repeat unit (I) is at least twice the molar amount of repeat unit (II). In one embodiment, the molar amount of repeat unit (I) is at least three times the molar amount of repeat unit (II). In one embodiment, the second polymer consists essentially of repeat units (I) and repeat units (II). In one embodiment, the repeat unit (I) is present. In one embodiment, the conjugated polymer is a self-doped conjugated polymer. In one embodiment, the conjugated polymer is a doped polymer. In one embodiment, the conjugated polymer is a sulfonated polymer. In one embodiment, the conjugated polymer is a sulfonated polythiophene. In one embodiment, the conjugated polymer is a sulfonated polythiophene and the repeat unit (I) is present and the conjugated polymer and the second polymer are soluble, and the Ph is substituted by —OH and —OR at the 4-position.

In one embodiment, R increases contact angle. In one embodiment, R decreases contact angle. In one embodiment, R increases or decreases contact angle at least 10 degrees. In one embodiment, R increases or decreases contact angle at least 20 degrees. In one embodiment, the repeat unit —[CH$_2$—CH(Ph-OH)]— is present.

In one embodiment, the composition further comprises a solvent carrier. In one embodiment, the composition comprises a solvent carrier comprising water and at least one second solvent. In one embodiment, R comprises an ethylene oxide group.

In one embodiment, a device is provided comprising a composition according to compositions described and claimed herein. In one embodiment, the device is an OLED, PLED, SMOLED, or OPV device.

In one embodiment, a method is provided comprising modifying a poly(vinylphenol) with hydrophilic or hydrophobic groups to adapt a hole injection or hole transport layer.

In one embodiment, a composition comprises: at least one conjugated polymer, at least one second polymer comprising at least one side group comprising at least one —OR functionality, wherein R comprises a fluorinated group, an alkyl group, an alkylsulfonic acid group, an alkylene oxide group, and combinations thereof.

In one embodiment, the second polymer has a glass transition temperature of at least about 25° C. In one embodiment, the second polymer has a decomposition temperature of at least about 180° C. In one embodiment, the second polymer comprises a carbon backbone. In one embodiment, the —OR functionality is bonded to an aromatic ring. In one embodiment, the —OR functionality is bonded to a single aromatic ring. In one embodiment, the —OR functionality is bonded to a fused aromatic ring system. In one embodiment, the —OR functionality is bonded to a naphthyl ring system. In one embodiment, the second polymer comprises at least one heteroatom in the backbone. In one embodiment, the second polymer is water soluble or water dispersible. In one embodiment, the second polymer comprises non-acidic fluorinated chains.

At least one advantage of at least one embodiment described herein is extended device lifetime including extended OLED device lifetime.

Another advantage of at least one embodiment described herein is improved OPV performance.

Another advantage of at least one embodiment described herein is improved wetting behavior for fabrication of a device, particularly an organic electronic device.

Another advantage of at least one embodiment described herein is improved ink jet printing, particularly useful for fabrication of organic electronic devices.

Another advantage of at least one embodiment described herein is optically clear films, particularly useful for example if light is to pass through the layer.

Another advantage in at least one embodiment includes, for example, ability to reduce and/or eliminate shorts on pixilated substrates.

DETAILED DESCRIPTION

Introduction/Conjugated Polymer

Figure 1:
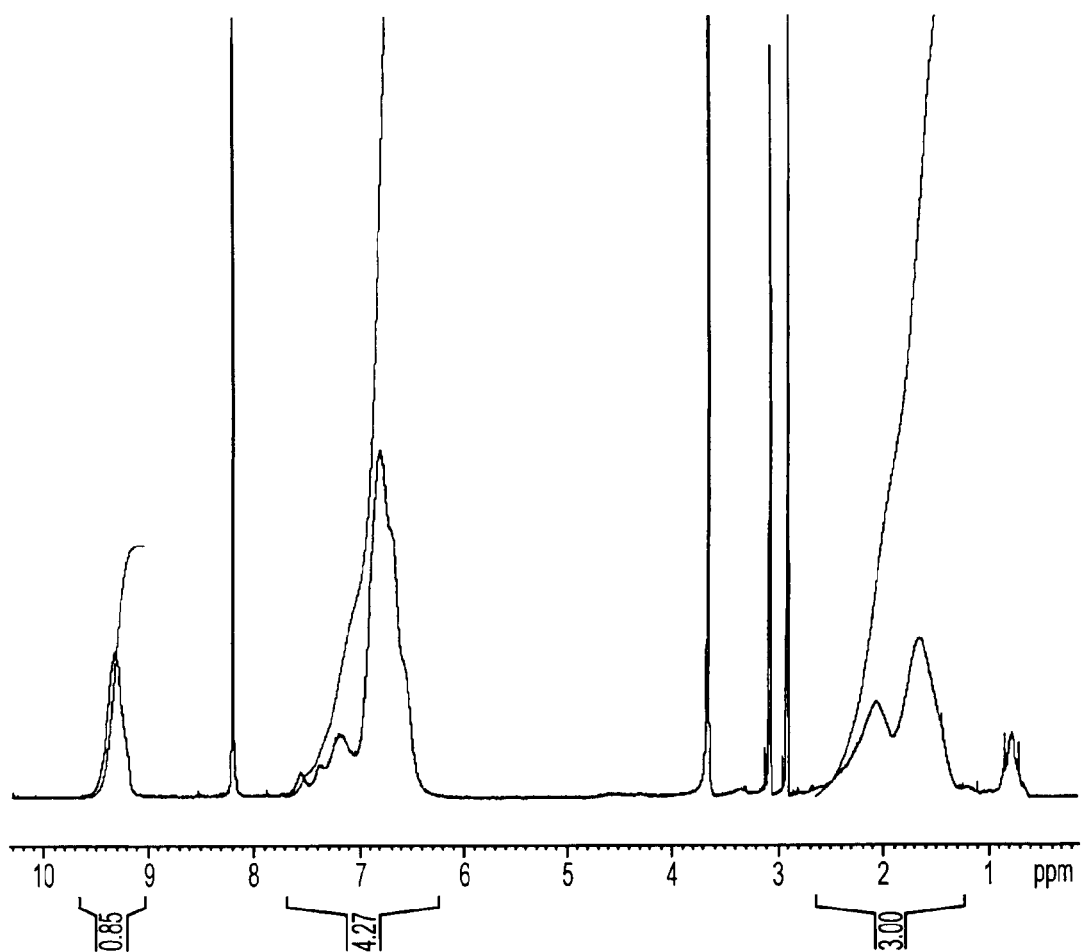
FIG. 1 illustrates $^1$H-NMR spectrum of perfluoroalkylated poly(4-vinylphenol).

All references cited herein are incorporated by reference in their entirety.

Priority U.S. provisional application 61/034,476 filed Mar. 6, 2008 is hereby incorporated by reference in its entirety.

In formulations as described herein, a first polymer can be a conjugated polymer. Polymers are known in the art including their use in organic electronic devices. See for example Friend, "Polymer LEDs," *Physics World*, November 1992, 5, 11, 42-46.

Conjugated polymers are also known in the art. See for example Kraft et al., "Electroluminescent Conjugated Polymers-Seeing Polymers in a New Light," *Angew. Chem. Int Ed.* 1998, 37, 402-428.

Electrically conductive or conjugated polymers are described in *The Encyclopedia of Polymer Science and Engineering*, Wiley, 1990, pages 298-300, including polyacetylene, poly(p-phenylene), poly(p-phenylene sulfide), polypyrrole, and polythiophene, which is hereby incorporated by reference in its entirety. This reference also describes blending and copolymerization of polymers, including block copolymer formation.

Conjugated polymer including polythiophenes can be homopolymers, copolymers, or block copolymers. Synthetic methods, doping, and polymer characterization, including regioregular polythiophenes with side groups, is provided in, for example, U.S. Pat. No. 6,602,974 to McCullough et al. and U.S. Pat. No. 6,166,172 to McCullough et al., which are hereby incorporated by reference in their entirety. Additional description can be found in the article, "The Chemistry of Conducting Polythiophenes," by Richard D. McCullough, *Adv. Mater.* 1998, 10, No. 2, pages 93-116, and references cited therein, which is hereby incorporated by reference in its entirety. Another reference which one skilled in the art can use is the *Handbook of Conducting Polymers*, $2^{nd}$ Ed. 1998, Chapter 9, by McCullough et al., "Regioregular, Head-to-Tail Coupled Poly(3-alkylthiophene) and its Derivatives," pages 225-258, which is hereby incorporated by reference in its entirety. This reference also describes, in chapter 29, "Electroluminescence in Conjugated Polymers" at pages 823-846, which is hereby incorporated by reference in its entirety.

Polythiophenes are described, for example, in Roncali, J., *Chem. Rev.* 1992, 92, 711; Schopf et al., *Polythiophenes: Electrically Conductive Polymers*, Springer: Berlin, 1997. See also for example U.S. Pat. Nos. 4,737,557 and 4,909,959.

Polymeric semiconductors are described in, for example, "Organic Transistor Semiconductors" by Katz et al., *Accounts of Chemical Research*, vol. 34, no. 5, 2001, page 359 including pages 365-367, which is hereby incorporated by reference in its entirety.

Block copolymers are described in, for example, *Block Copolymers, Overview and Critical Survey*, by Noshay and McGrath, Academic Press, 1977. For example, this text describes A-B diblock copolymers (chapter 5), A-B-A triblock copolymers (chapter 6), and -(AB)$_n$- multiblock copolymers (chapter 7), which can form the basis of block copolymer types as described herein.

Additional block copolymers including polythiophenes are described in, for example, Francois et al., *Synth. Met* 1995, 69, 463-466, which is incorporated by reference in its entirety; Yang et al., *Macromolecules* 1993, 26, 1188-1190; Widawski et al., *Nature (London)*, vol. 369, Jun. 2, 1994, 387-389; Jenekhe et al., *Science*, 279, Mar. 20, 1998, 1903-1907; Wang et al., *J. Am. Chem. Soc.* 2000, 122, 6855-6861; Li et al., *Macromolecules* 1999, 32, 3034-3044; Hempenius et al., *J. Am. Chem. Soc.* 1998, 120, 2798-2804;

The following article describes several types of regioregular systems beginning at page 97 and references cited therein: "The Chemistry of Conducting Polythiophenes," by Richard D. McCullough, *Adv. Mater.* 1998, 10, No. 2, pages 93-116. In a regioregular polymer, including a polythiophene, the degree of regioregularity can be, for example, about 90% or more, or about 95% or more, or about 98% or more, or about 99% or more. Methods known in the art such as, for example, NMR can be used to measure the degree of regioregularity. In one embodiment, the degree of regioregularity is greater than about 75%. In another embodiment, the degree of regioregularity is between about 85% and 100%.

Regioregularity can arise in multiple ways. For example, it can arise from polymerization of asymmetric monomers such as a 3-alkylthiophene to provide head-to-tail (HT) poly(3-substituted)thiophene. Alternatively, it can arise from polymerization of monomers which have a plane of symmetry between two portions of monomer such as for example a bi-thiophene, providing for example regioregular HH-TT and TT-HH poly(3-substituted thiophenes).

In particular, substituents which can be used to solubilize conducting polymers with side chains include alkoxy and alkyl including for example C1 to C25 groups, as well as heteroatom systems which include for example oxygen and nitrogen. In particular, substituents having at least three carbon atoms, or at least five carbon atoms can be used. Mixed substituents can be used. The substituents can be nonpolar, polar or functional organic substituents. The side group can be called a substituent R which can be for example alkyl, perhaloalkyl, vinyl, acetylenic, alkoxy, aryloxy, vinyloxy, thioalkyl, thioaryl, ketyl, thioketyl, and optionally can be substituted with atoms other than hydrogen.

Thiophene polymers can be star shaped polymers with the number of branches being for example more than three and comprising thiophene units. Thiophene polymers can be dendrimers. See for example Anthopoulos et al., Applied Physics Letters, 82, 26, Jun. 30, 2003, 4824-4826, and further description of dendrimers hereinafter.

Heterocyclic polymers are particularly preferred. A particularly preferred system is the polythiophene system and the regioregular polythiophene system. Polymers can be obtained from Plextronics, Inc., Pittsburgh, Pa. including for example polythiophene-based polymers such as for example Plexcore, Plexcoat, and similar materials.

Another embodiment includes heterocyclic conjugated polymers which are relatively regioirregular. For example, the degree of regioregularity can be about 90% or less, or about 80% or less, or about 70% or less, or about 60% or less, or about 50% or less.

An example of a first polymer is a water soluble polymer, including a sulfonated polymer.

Additional embodiments may provide compositions formed of various combinations of the aforementioned compositions of the previous embodiments, said compositions further comprising conducting polymers such as commercially available polyaniline (PANi) compositions 650013 or 649996, poly(3,4-ethylenedioxythiophene) (PEDOT) formula 675288, 649813, 649821, 649805, 649791, 649783, 687316, or 678932, and polypyrrole dispersions without PEDOT 482552 formula available from Sigma-Aldrich Co.

Sulfonation of Conducting Polymers and Polythiophenes

One example of a conjugated polymer is a sulfonated conjugated polymer including a sulfonated polythiophene and a sulfonated regioregular polythiophene. See for example U.S. patent application Ser. No. 11/826,394 filed Jul. 13, 2007 to Seshadri et al. which is hereby incorporated by reference in its entirety, including figures, working examples, and claims.

When a regioregular polymer is subjected to sulfonation, the polymer composition can be yet called regioregular for present purposes. Sulfonation is generally known in the art, wherein there is an introduction into an organic molecule of the sulfonic acid group or its salts, —$SO_3H$, wherein the sulfur atom is bonded to carbon of the organic molecule. Examples in the patent literature include for example U.S. Pat. No. 5,548,060 to Allcock et al.; U.S. Pat. No. 6,365,294 to Pintauro et al.; U.S. Pat. No. 5,137,991 to Epstein et al.; and 5,993,694 to Ito et al. Additional sulfonation methods are described in for example (1) Sotzing, G. A. Substituted thieno [3,4-b]thiophene polymers, method of making and use thereof, US2005/0124784A1; (2) Lee, B.; Seshadri, V.; Sotzing, G. A. Ring Sulfonated poly(thieno[3,4-b]thiophene), *Adv. Mater.* 2005, 17, 1792.

The sulfonated substituent can be in various forms. For example, the sulfonated substituent can be in acid form; or the sulfonated substituent can be in salt form comprising a counterion; or the sulfonated substituent can be in salt form comprising a counterion, wherein the counterion comprises organic groups; or the sulfonated substituent can be in salt form comprising a counterion, wherein the counterion comprises an organic cation including for example alkyl groups and is free of metal; or the sulfonated substituent is in salt form comprising a counterion, wherein the counterion comprises a metal cation. The degree of sulfonation can be controlled to for example about 5% to about 95%, or about 10% to about 90%, or to about 25% to about 75%. As sulfonation progresses, the sulfonated polythiophene is solubilized and/or dispersed in a strong acid. The direct bonding of the sulfonate sulfur atom to the polythiophene can allow for adjustments of band gap structure.

The conjugated polymer can be a doped polymer, including for example a self-doped polymer including a sulfonated conjugated polymer. Known dopants can be used including inorganic and organic dopants.

Second Polymer/Planarizing Agent

A composition can comprise a first polymer, a conjugated polymer, mixed with at least one second polymer. The second polymer can be a planarization agent, and the compositions can be used as, for example, hole injection or hole transport layers in organic electronic devices.

The second polymer can be an organic polymer. It can be a synthetic polymer. The second polymer can be for example a polymer sufficiently stable at annealing temperatures of interest such as for example about 170° C. Hence, for example, the polymer can have a decomposition temperature which is at least about 180° C., or at least about 200° C.

The second polymer can have a glass transition temperature which is at least about 25° C., or at least about 50° C., or at least about 75° C., or at least about 100° C.

The second polymer can be adapted for use in solvent carriers that comprise water including aqueous solvent carriers.

The second polymer can comprise an all carbon backbone or it can also comprise at least one heteroatom such as, for example nitrogen or oxygen. The backbone can comprise, for example, alkyleneoxy units such as ethyleneoxy or propyleneoxy.

The second polymer can comprise at least one side group comprising at least one —OR functionality, or at least two OR functionalities, wherein R comprises a fluorinated group, an alkyl group, an alkylsulfonic acid group, an alkylene oxide group, and combinations thereof. In the second polymer, a plurality of side groups can be present including side groups which have unmodified —OH groups. The ratio of monomer repeat units with —OR and —OH side groups can be adapted to achieve the desired properties.

The second polymer can comprise aromatic or non-aromatic side groups.

In particular, the second polymer can comprise repeat units represented by:

(I) optionally, —[CH$_2$—CH(Ph-OH)]— and
(II) —[CH$_2$—CH(Ph-OR)]— wherein Ph is a phenyl ring and R comprises a fluorinated group, an alkyl group, an alkylsulfonic acid group, or an alkylene oxide group. The phenyl ring can comprise additional —OH and —OR groups such that it comprises for example two —OH or two —OR groups.

In particular, the second polymer can be a derivative of poly(4-vinylphenol) wherein the hydroxyl of the phenol is derivatized as known in the art. The second polymer can comprise repeat units represented by:

(I) optionally, —[CH$_2$—CH(Ph-OH)]— and
(II) —[CH$_2$—CH(Ph-OR)]— wherein Ph is a phenyl ring and R comprises a fluorinated group, an alkyl group, an alkylsulfonic acid group, or an alkylene oxide group. The repeat unit (I) can be present in a preferred embodiment. In some cases, however, substantially all repeat units can be (II). The Ph ring can be substituted at any of the positions including for example at the 4-position or at the 3-position. In particular, the relative positions of the polymer backbone attached to the phenyl ring and the substituent can be ortho, meta, or para. The second polymer can have 1, 2, 3, 4, or 5 hydroxyl or —OR attached on the phenyl ring.

In one embodiment, the polymer can be represented by —[CH$_2$—CH-Ph-OH]$_{n-x}$— [CH$_2$—CH-Ph-OR]$_x$—. The values of x and n can be varied as known in the art and can be for example 0.1 to 1.

The molar amount of the repeat unit (I) can be greater than, including at least twice or at least three times, the molar amount of the repeat unit (II).

The second polymer can consist essentially of repeat units (I) and (II). Additional repeat units can be tolerated in amounts which do not interfere with the basic and novel features of preferred embodiments.

In another embodiment, the second polymer can be one of the polymers described in copending provisional application Ser. No. 60/032,905 filed Feb. 29, 2008, now U.S. Ser. No. 12/395,327 filed Feb. 27, 2009 ("Planarizing Agents and Devices") including polymers comprising carbon backbone and side groups comprising optionally functionalized fused ring systems, including hydroxyl functionalized fused aromatic ring systems. The number of functional groups, or substituents per side group can be varied and can be for example one, two, or three. The site of substitution can be also varied. For example, the polymer chain can be bonded at the 2-position of the naphthyl group and the substituent can be at the 6 or 7 position. The number of aromatic rings in the fused system can be, for example, two so that the polymer can be formulated in a carrier comprising water. An example is the naphthyl or naphthol group linked to a polymer chain. In a naphthol embodiment, the number of hydroxyl units bonded to the side group can be varied and one can have, for example, one, two, or three hydroxyl units. The aromatic ring or rings can have optional substitution in addition to a hydroxyl substitution.

Other examples for the second polymer include a (meth) acrylate or acrylamide polymer.

The number average molecular weight can be for example about 3,600 to about 60,000, or more particularly, about 6,000 to about 12,000.

Additional embodiments for modification are described below.

Fluorinated Groups

In one embodiment for polymer modification, the R group can comprise a fluorinated group or a group comprising at least one fluorine atom, which is an example of a hydrophobic group. In particular, the R group can be prepared from a perfluorinated compound or comprise a perfluorinated group. The R group comprising a fluorinated group can comprise a linear chain of atoms such as a carbon chain or a carbon chain also comprising non-carbon heteroatoms like oxygen. For example, the R group can be prepared with use of vinyl ethers. The R group can comprise repeating —CF$_2$— units. The R group can terminate with a terminal trifluoromethyl, —CF$_3$, group. In some embodiments, the fluorinated group can comprise at least one hydrogen substituent which adds to the group as a result of addition reaction from the phenolic hydrogen to a perfluorinated compound. In this embodiment, the side group is considered perfluorinated.

In one embodiment, polyvinylphenol can be modified using trifluorovinylether by an addition reaction wherein the phenol added across the vinylic bond in the presence of catalytic amount of a base. This can provide a work function of the hole injection layer to be about 5.5 eV as measured by Kelvin probe.

Non-acidic fluorinated materials can be used to increase the work-function as with the perfluorosulfonic acid polymers, similar to Nafion. Non-acidic fluorinated materials are known in the art. See, for example, *Concise Encyclopedia of Polymer Science and Engineering*, Wiley, 1990 including article on "Fluorine-Containing Polymers" and references cited therein. The number of components which can provide deep work-function HILs can be provided with but two polymers.

In addition, the surface energy can be controlled by altering the microstructure of the fluoropolymer or perfluoropolymer.

The reaction can be carried out in non-fluorocarbon solvent. Because the reaction is quantitative, the percent fluoroalkyl chains tethered can be varied and thereby help to control the surface energy and wetting characteristics of the final film.

Alkyl Group

In another polymer modification embodiment, the R group can comprise an alkyl group, which is an example of a hydrophobic group. The alkyl groups can have for example 1 to 25 carbon atoms, or 2 to 20 carbon atoms, or 3 to 15 carbon atoms, or 4 to 10 carbon atoms. Examples include methyl, ethyl, propyl, butyl, pentyl, hexyl, heptyl, octyl, nonyl, and docecyl, including isomers in a family of isomeric structures. The R group can be for example linear or branched. The R group can be represented by —(CH$_2$)$_n$CH$_3$ where n is from 0 to 25, or n is 1 to 25.

The degree of modification can be from 1 percent to 100 percent, or about 15 percent to about 50 percent, or about 20 percent to about 40 percent.

By modifying only a fraction of the repeat units in poly(4-vinylphenol), one has the ability to tune the properties better than if all of the repeat units are modified. Furthermore, modifying only small portions of the polymer does not impact its solubility in polar solvents such as alcohols, cellosolves, or carbitols, or its ability to be made into an aqueous formulation. At the same time, after the film is annealed, the functional groups tethered to the backbone such as the alkyl chains moves to the film surface leading to the modification of the wetting. Hence, one can lower the contact angle of xylene-based LEP on top of a nafion-containing hole injection layer. An advantage is that the surface energy can be modified without negatively impacting the performance of an OLED device.

Alkylsulfonic Acid Group

In another embodiment for polymer modification, the R group can also comprise an alkylsulfonic acid group, which is an example of a hydrophilic group. The "alkyl" part of alkylsulfonic acid can function as a spacer between the polymer and the sulfonic acid functional group. For example, the alkyl can be —$(CH_2)_n$— where n is 1 to 20, or 2 to 10, or 2 to 5. In particular, propylsulfonic acid can be used.

The sulfonic acid can be in different forms depending on the pH. For example, it can be acidic or basic, and if in salt form, the cation can be varied. Alkali metal salts can be exchanged for protons by passing through an $H^+$ form ion-exchange resin. The protons can be exchanged into other alkali metal salts by passing the acid form through respective ion exchange resins.

The mole percentage of the modified alkylsulfonic acid groups can be varied from, for example, 5% to 100%.

Alkylene Oxide Group

In still another embodiment for polymer modification, the R group can also comprise an alkylene oxide group, a group which is known in the art, which is an example of a hydrophilic group, including for example a propylene oxide or an ethylene oxide group, or mixtures thereof. The alkyleneoxy repeat unit can comprise, for example, two to six carbon atoms including linear or branched groups. The group can comprise for example two alkylene oxide groups capped with an alkoxy group such as a methoxy group. The number of alkyleneoxy repeat units in the side chain is not particularly limited but can be, for example, one to fifty, or two to thirty.

Additional Components

In one embodiment, the composition can further comprise at least one third polymer. For example, the third polymer can be an ionic polymer including an ionic fluorinated polymer. An example is a fluorinated polymer or an ionomer such as, for example, Nafion or polystyrene sulfonate.

The amount of the third polymer in weight percentage can be for example less than the weight percentage of the conjugated polymer.

Inks and Formulations

One can blend solvents, polymers, and/or additives together to form inks (and films from the ink) with specific properties, tailored for particular applications.

For example, one can use a sulfonated modification or derivative of poly(4-vinylphenol) to be able to use a new co-solvent in order to raise the surface tension of the ink. Other examples of modification and formulation include:
 a. Alkyl modification—to modify the surface energy of an HIL film
 b. Fluoro modification—to modify the work function of an HIL film without the need for a second polymer
 c. Alkylene oxide—to enable the use of less co-solvent as well as improving compatibility with conductive polymer and forming HIL films which are more smooth.

The mixture of polymers can be formulated with a solvent carrier system to form an ink. The solvent carrier can comprise a single solvent or a mixture of a plurality of solvents. For example, the carrier system can comprise water and at least one second solvent. The solvent can be adapted to dissolve the polymers when the conjugated polymer and the second polymer are soluble polymers.

The inks can be adapted for particular types of coating and application methods. For example, some inks can be adapted for ink jet printing and other inks can be adapted for spin coating. Other methods include for example slot die, dip coating, screen printing, gravure, Microgravure™, flexo, offset, and the like.

One or more solvents with increasing surface tension can be used in the formulations to obtain higher surface tension which is important for many ink jet printing applications including printing into small pre-defined pixels for displays. Another consideration is that the components of the ink can influence the contact angle of the subsequent layer onto the HIL providing, for example, improved wetting and layer formation.

The viscosity of the formulation can be adapted for a particular printing method. For example, the viscosity of the formulation can be for example about 1 cP to about 40 cP, or about 1 cP to about 20 cP, or about 2 cP to about 15 cP, or about 20 cP to about 40 cP.

The surface tension of the formulation can be adapted for a particular application. For example, the surface tension of the formulation can be for example at least about 60 dyne/cm, or at least about 70 dyne/cm, or about 60 dyne/cm to about 90 dyne/cm, or about 70 dyne/cm to about 80 dyne/cm. An exemplary range is about 30 dyne/cm to about 70 dyne/cm, or about 30 dyne/cm to about 40 dyne/cm.

The conducting polymer and polythiophene compositions, which can be sulfonated as described above, can be formulated and blended by methods known in the art to formulators including, for example, varying the amounts of the components, varying combinations of different structural types, use of different mixing conditions, using different solvents, applying different film preparation conditions, using different purification methods, and the like. Formulations for specific applications in hole injection technology are particularly important. One or more first polymers can be used. One or more second polymers can be used.

Amounts

The relative amounts in for example weight percent for the first and second polymers can be varied for the application. For example, the weight percentage of the second polymer can be more than the weight percentage of the first polymer. In particular, the weight percentage of the second polymer can be at least two, three, four, five, six, seven, eight, nine, or at least ten times the weight percentage of the first polymer.

The percent solids in the formulation can be varied for an application. For example, the percent solids can be 0.5 wt. % to 5 wt. %, or 1 wt. % to 3 wt. %.

Preparing Films

Known methods can be used to process inks into film or coating form. For example, ink jet printing, spin coating, slot die coating, dip coating, screen printing. Gravure, Microgravure™, flexo, offset, and other known methods can be used.

Devices and Applications

Devices and device fabrication methods are known in the art including organic electronic devices and optoelectronic devices. Various devices can be fabricated in many cases using multilayered structures which can be prepared by for example solution or vacuum processing, as well as printing and patterning processes. In particular, use of the embodiments described herein for hole injection layers (HILs) can be carried out effectively. In particular, applications include hole injection layer or hole transport layer for OLEDs, PLEDs, SMOLEDs, ESDs, photovoltaic cells, OPVs, supercapacitors, cation transducers, drug release, electrochromics, sensors, FETs, actuators, RFID, and membranes. Another application is as an electrode modifier including an electrode modifier for an organic field effect transistor (OFETS). Other applications include those in the field of printed electronics, printed electronics devices, and roll-to-roll production processes.

Also, for example, photovoltaic devices are known in the art. The devices can comprise, for example, multi-layer structures including for example an anode, including a transparent conductor such as indium tin oxide (ITO) on glass or PET; a hole injection layer and/or a hole transport layer; a P/N bulk heterojunction layer; a conditioning layer such as LiF; and a cathode such as for example Ca, Al, or Ba. Devices can be adapted to allow for current density versus voltage measurements.

Similarly, OLED devices are known in the art. The devices can comprise, for example, multi-layer structures including for example an anode, including a transparent conductor such as ITO on glass or PET or PEN; a hole injection layer; an electroluminescent layer such as a polymer layer; a conditioning layer such as LiF, and a cathode such as for example Ca, Al, or Ba.

Methods known in the art can be used to fabricate devices including for example OLED and OPV devices. Methods known in the art can be used to measure brightness, efficiency, and lifetimes. OLED patents include for example U.S. Pat. Nos. 4,356,429 and 4,539,507 (Kodak). Conducting polymers which emit light are described in for example U.S. Pat. Nos. 5,247,190 and 5,401,827 (Cambridge Display Technologies). See also Kraft et al., "Electroluminescent Conjugated Polymers—Seeing Polymers in a New Light," Angew. Chem. Int. Ed., 1998, 37, 402-428, including device architecture, physical principles, solution processing, multilayering, blends, and materials synthesis and formulation, which is hereby incorporated by reference in its entirety.

Light emitters known in the art and commercially available can be used including various conducting polymers as well as organic molecules, such as materials available from Sumation, Merck Yellow, Merck Blue, American Dye Sources (ADS), Kodak (e.g., AlQ3 and the like), and even Aldrich such as BEHP-PPV. Examples of such organic electroluminescent materials include:

(i) poly(p-phenylene vinylene) and its derivatives substituted at various positions on the phenylene moiety;

(ii) poly(p-phenylene vinylene) and its derivatives substituted at various positions on the vinylene moiety;

(iii) poly(p-phenylene vinylene) and its derivatives substituted at various positions on the phenylene moiety and also substituted at various positions on the vinylene moiety;

(iv) poly(arylene vinylene), where the arylene may be such moieties as naphthalene, anthracene, furylene, thienylene, oxadiazole, and the like;

(v) derivatives of poly(arylene vinylene), where the arylene may be as in (iv) above, and additionally have substituents at various positions on the arylene;

(vi) derivatives of poly(arylene vinylene), where the arylene may be as in (iv) above, and additionally have substituents at various positions on the vinylene;

(vii) derivatives of poly(arylene vinylene), where the arylene may be as in (iv) above, and additionally have substituents at various positions on the arylene and substituents at various positions on the vinylene;

(viii) co-polymers of arylene vinylene oligomers, such as those in (iv), (v), (vi), and (vii) with non-conjugated oligomers; and (ix) polyp-phenylene and its derivatives substituted at various positions on the phenylene moiety, including ladder polymer derivatives such as poly(9,9-dialkyl fluorene) and the like;

(x) poly(arylenes) where the arylene may be such moieties as naphthalene, anthracene, furylene, thienylene, oxadiazole, and the like; and their derivatives substituted at various positions on the arylene moiety;

(xi) co-polymers of oligoarylenes such as those in (x) with non-conjugated oligomers;

(xii) polyquinoline and its derivatives;

(xiii) co-polymers of polyquinoline with p-phenylene substituted on the phenylene with, for example, alkyl or alkoxy groups to provide solubility; and (xiv) rigid rod polymers such as poly(p-phenylene-2,6-benzobisthiazole), poly(p-phenylene-2,6-benzobisoxazole), polyp-phenylene-2,6-benzimidazole), and their derivatives.

Preferred organic emissive polymers include SUMATION Light Emitting Polymers ("LEPs") that emit green, red, blue, or white light or their families, copolymers, derivatives, or mixtures thereof; the SUMATION LEPs are available from Sumation. Other polymers include polyspirofluorene-like polymers available from Covion Organic Semiconductors GmbH, Frankfurt, Germany (now owned by Merck®).

Alternatively, rather than polymers, small organic molecules that emit by fluorescence or by phosphorescence can serve as the organic electroluminescent layer. Examples of small-molecule organic electroluminescent materials include: (i) tris(8-hydroxyquinolinato)aluminum (Alq); (ii) 1,3-bis(N,N-dimethylaminophenyl)-1,3,4-oxidazole (OXD-8); (iii) -oxo-bis(2-methyl-8-quinolinato)aluminum; (iv) bis (2-methyl-8-hydroxyquinolinato) aluminum; (v) bis(hydroxybenzoquinolinato) beryllium (BeQ.sub.2); (vi) bis (diphenylvinyl)biphenylene (DPVBI); and (vii) arylamine-substituted distyrylarylene (DSA amine).

Such polymer and small-molecule materials are well known in the art and are described in, for example, U.S. Pat. No. 5,047,687 issued to VanSlyke; and Bredas, J.-L., Silbey, R., eds., Conjugated Polymers, Kluwer Academic Press, Dordrecht (1991).

Examples of HIL in devices include:

1) Hole injection in OLEDs including PLEDs and SMOLEDs; for example, for HIL in PLED, all classes of conjugated polymeric emitters where the conjugation involves carbon or silicon atoms can be used. For HIL in SMOLED, the following are examples: SMOLED containing fluorescent emitters; SMOLED containing phosphorescent emitters; SMOLEDs comprising one or more organic layers in addition to the HIL layer; and SMOLEDs where the small molecule layer is processed from solution or aerosol spray or any other processing methodology. In addition, other examples include HIL in dendrimer or oligomeric organic semiconductor based OLEDs; HIL in ambipolar light emitting FET's where the HIL is used to modify charge injection or as an electrode;

2) Hole extraction layer in OPV:

3) Channel material in transistors

4) Channel material in circuits comprising a combination of transistors such as logic gates 5) Electrode material in transistors 6) Gate layer in a capacitor 7) Chemical sensor where modification of doping level is achieved due to association of the species to be sensed with the conductive polymer.

A variety of photoactive layers can be used in OPV devices. Photovoltaic devices can be prepared with photoactive layers comprising fullerene derivatives mixed with for example conducting polymers as described in for example U.S. Pat. No. 5,454,880 (Univ. Cal.); U.S. Pat. Nos. 6,812,399; and 6,933,436.

Common electrode materials and substrates, as well as encapsulating materials can be used.

Testing of devices with poly(4-vinylphenol)-based HIL, with work function adjusted to −5.25 eV, using for example a green LEP can give lifetimes more than twice that of a PEDOT based hole injection layer.

In addition, films obtained using sulfonated polythiophene formulations and modified polymers as described herein can give very clear and smooth films compared to the polyvinylphenol polymers.

Planarizing agents can be used in hole injection layers or electron injection layers. They can be used in gate dielectrics for OFETs. A potential barrier coating can be made wherein the phenol is reacted further with aluminum alkoxides and other inorganic alkoxides to form polymer-alumina hybrid materials to reduce oxygen or moisture permittivity.

WORKING EXAMPLES

The following non-limiting working examples provide further embodiments.

The following scheme summarizes reactions described further in the working examples:

Synthetic scheme for preparing the various modified poly(4-vinylphenols)

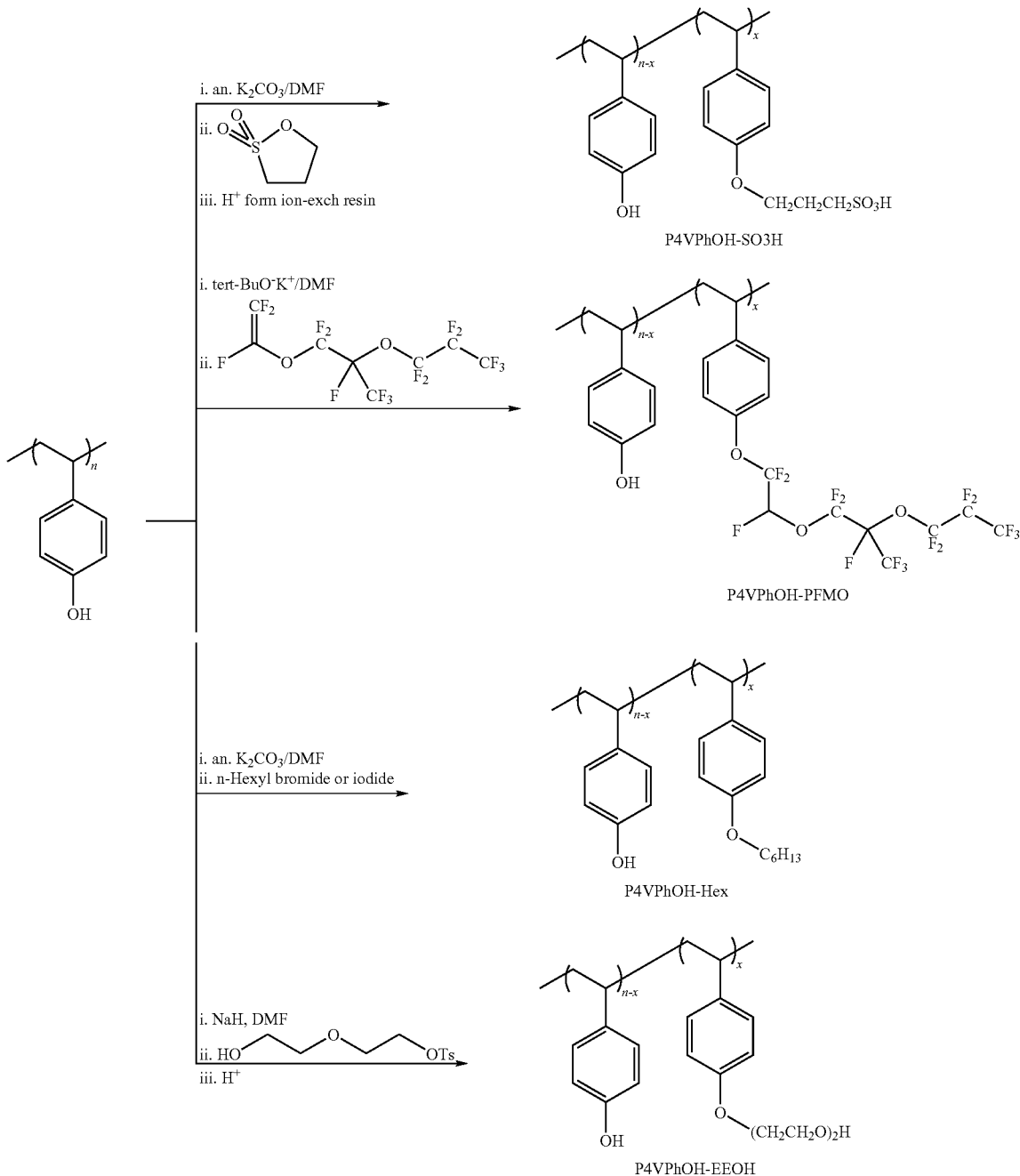

Section I. Perfluorinated Polymer Working Examples
Synthesis and characterization of perfluoroalkylated poly(4-vinylphenol).

Synthesis of poly(4-vinylphenol-co-1-(1,1,2-trifluoro-2-(1,1,2,3,3,3-hexafluoro-2-(perfluoropropoxy)propoxy)ethoxy)-4-vinylbenzene) (P4VPhOH-PFMO)

Figure 2:
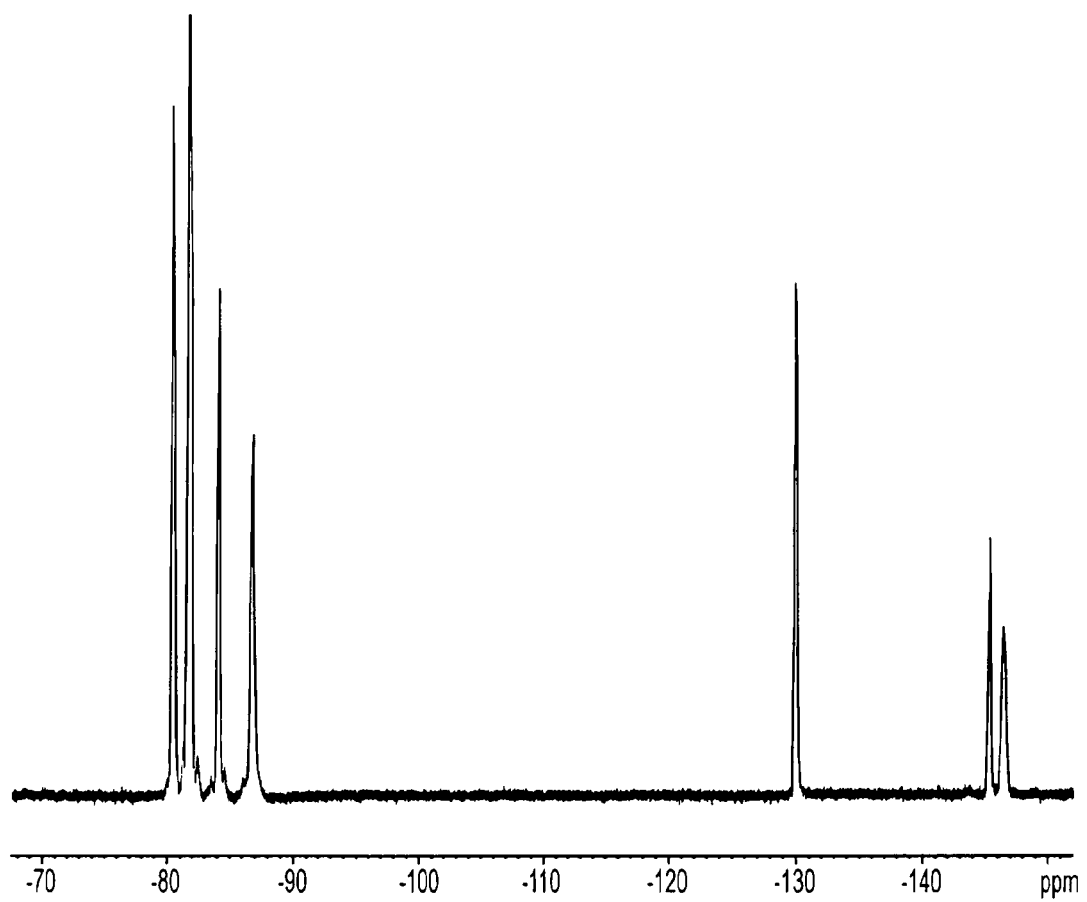
FIG. 2 illustrates $^{19}$F-NMR spectrum of perfluoroalkylated poly(4-vinylphenol).

To a clean dry 250 mL 2 neck RBF, cannulated 100 mL anhydrous DMF followed by addition of 10 g poly(4-vinylphenol). Upon complete dissolution of the polymer in the solvent added 0.15 eq potassium tert-butoxide (1.40 g) (only catalytic amount is required for this reaction, hence for higher amounts of substitution the same amount is sufficient). Stir the reaction mixture for 15 min at room temperature and added 0.15 eq (5.40 g) perfluoro(5-methyl-3,6-dioxanon-1-ene). Stirred the reaction for 14 h at room temperature and precipitated in 1 L 1N HCl. Filtered the precipitated polymer and washed with 100 mL of de-ionized water. The polymer is stirred again in 100 mL 1N HCl with heating to warm conditions for 1 h and filtered. Stirred polymer again in water for 1 h with heating to warm conditions and filtered. Wash with de-ionized water and dry in vacuum oven for 48 h at 40-50° C. Yield was nearly quantitative. The $^1$H NMR and $^{19}$F NMR spectra are shown in FIGS. 1 and 2, respectively.

The conversion to fluorinated side group was deemed to be about 15% based on stoichiometry and NMR data.

Inks and Properties of Films

Films were prepared via spin coating (800 rpm/40 seconds) followed by annealing on a hot plate at 170° C. for 15 minutes. Contact angles were measured with use of a Rame-hart Goniometer). Surface energy was measured with use of a Sensadyne tensiometer model C500L. Work function was measured with use of a Kelvin probe with gold as reference to measure the work-function of the HILs.

The conjugated polymer (intrinsically conductive polymer, ICP) was a sulfonated regioregular polythiophene prepared by sulfonation of poly(3-(methyloxyethoxyethoxy)thiophene-2,5-diyl). All working examples described herein used this polymer as an ICP unless otherwise indicated.

The acid equivalent was determined to be 74.4 mg NaOH per gram of sulfonated polymer. Elemental analysis (CHS) of the polymer was done at Galbraith Laboratories Inc. and the CHS content was determined to be 43.22, 3.37 and 23.44% by weight, respectively. Based on the C/S ratio, the sulfonation level was determined to be about 83%.

Ink formulations were prepared to investigate the impact of the fluorine modification on the surface properties of the final film. In the following table, weight percentages are provided:

| HIL | ICP | Matrix Polymer | Water | Butyl Cellosolve | % TS |
|---|---|---|---|---|---|
| 1 | 0.3 | 2.8 (Nafion) | 96.9 | — | 3.1 |
| 2 | 0.3 | 1.8 (P4VPhOH) | 63.7 | 34.3 | 2.0 |
| 3 | 0.2 | 1.8 (P4VPhOH-PFMO - 15%) | 63.7 | 34.3 | 2.0 |

HIL 1: A solution of ICP (conductive polymer) in water (about 0.49% by weight) was prepared as described in U.S. patent application Ser. No. 11/826,394 filed Jul. 13, 2007 to Seshadri et al. This solution (9.61 g) was added to a vial along with water (1.15 g) and stirred for 30 minutes. Nafion purchased as a 10% by weight dispersion in water (4.24 g) was then added and mixed thoroughly. The solution was then passed through a 0.45 micron PVDF syringe filter (Millipore).

HIL 2: A solution of ICP (conductive polymer) in water (about 0.49% by weight) was prepared as described in U.S. patent application Ser. No. 11/826,394 filed Jul. 13, 2007 to Seshadri et al. This solution (9.18 g) was added to a vial along with water (0.42 g) and stirred for 30 minutes. Poly(4-vinylphenol) (0.26 g) was dissolved in 2-butoxyethanol (5.15 g) and heated with stirring until the polymer dissolved completely. The two solutions were then combined and mixed thoroughly. The solution was then passed through a 0.45 micron PVDF syringe filter (Millipore).

HIL3: This formulation was prepared identically to HIL 2 except that P4VPhOH-PFMO was added in place of P4VPhOH.

TABLE I

| HIL | Matrix Polymer | Solvent used to measure contact angle | Contact Angle (°) | Surface Energy (mJ/m$^2$) |
|---|---|---|---|---|
| 1 | Nafion | Water | 92.2 | 27.8 |
| 2 | P4VPhOH | Water | 56.2 | 50.1 |
| 3 | P4VPhOH-PFMO (15%) | Water | 99 | 23.6 |

Plates were annealed at 170° C. for 15 minutes.

In comparing films from HIL 2 to HIL 3 it should be noted that the fluorine-modified P4VPhOH has a significantly lower surface energy than the parent P4VPhOh and is similar to the Nafion-containing HIL.

Preparation and Testing of Devices
OLED Device Fabrication

The device fabrication described below is intended as an example and does not in any way imply the limitation to the said fabrication process, device architecture (sequence, number of layers etc.) or materials.

The OLED devices described herein were fabricated on indium tin oxide (ITO) surfaces deposited on glass substrates. The ITO surface was pre-patterned to define the pixel area of 0.9 cm$^2$. The device substrates were cleaned by ultrasonication in a dilute soap solution followed by distilled water for 20 minutes each. This was followed by ultrasonication in isopropanol. The substrates were dried under nitrogen flow, following which they were treated in a UV-Ozone chamber operating at 300 W for 20 minutes.

The cleaned substrates were then coated with the hole injection layer and dried at 170° C. for 15 minutes (60 nm dry film thickness). The coating process was done on a spin coater in a clean room environment but can be similarly achieved with spray coating, ink-jetting, contact printing or any other deposition method capable of resulting in an HIL film of the desired thickness. This was followed by the spin coating of the light emitting polymer (LEP) layer in inert atmosphere which was then dried at 170° C. for 15 minutes (75 nm dry film thickness).

The substrates were then transferred to a vacuum chamber in which, by means of physical vapor deposition, a cathode layer was deposited. In this example, the cathode layer was prepared by the sequential deposition of two metal layers, the first being a 5 nm layer of Ca (or Ba) (0.1 nm/sec) followed by a 200 nm layer of Al (0.5 nm/sec) with the base pressure at $5\times10^{-7}$ Torr.

The devices thus obtained were encapsulated with a glass cover slip to prevent exposure to ambient conditions by means of a UV-light curing epoxy resin cured at 80 W/cm² UV exposure for 4 minutes.

OLED Device Testing:

The OLEDs comprise pixels on a glass substrate whose electrodes extend outside the encapsulated area of the device which contain the light emitting portion of the pixels. The typical area of each pixel is 0.09 cm². The electrodes are contacted with a current source meter such as a Keithley 2400 source meter with a bias applied to the indium tin oxide electrode while the aluminum electrode is earthed. This results in positively charged carriers (holes) and negatively charged carriers being injected into the device which form excitons and generate light. In this example, the HIL assists the injection of charge carriers into the light emitting layer. This results in a low operating voltage of the device (defined as the voltage required to run a given current density through the pixel).

Simultaneously, another Keithley 2400 source meter is used to address a large area silicon photodiode. This photodiode is maintained at zero volts bias by the 2400 source meter. It is placed in direct contact with area of the glass substrate directly below the lighted area of the OLED pixel. The photodiode collects the light generated by the OLED converting them into photocurrent which is in turn read by the source meter. The photodiode current generated is quantified into optical units (candelas/sq. meter) by calibrating it with the help of a PR-670 SpectraScan® Spectroradiometer.

During the testing of the device, the Keithley 2400 addressing the OLED pixel applies a voltage sweep to it. The resultant current passing through the pixel is measured. At the same time the current passing through the OLED pixel results in light being generated which then results in a photocurrent reading by the other Keithley 2400 connected to the photodiode. Thus the voltage-current-light or IVL data for the pixel is generated. This in turn enables the measurement of other device characteristics such as the lumens per Watt of electrical input power to the pixel and candelas per ampere of pixel current.

Figure 3:
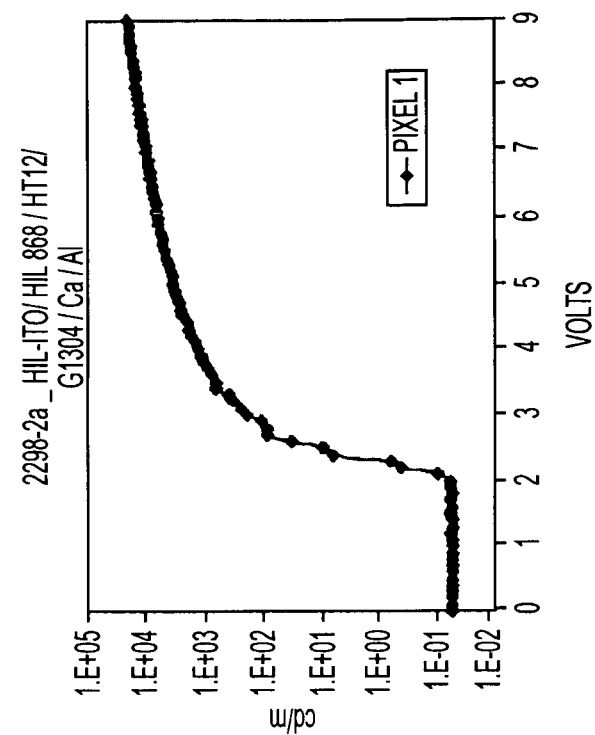
FIG. 3 shows IVL (current-voltage-luminance) for an OLED with a hole injection layer.
Figure 3:
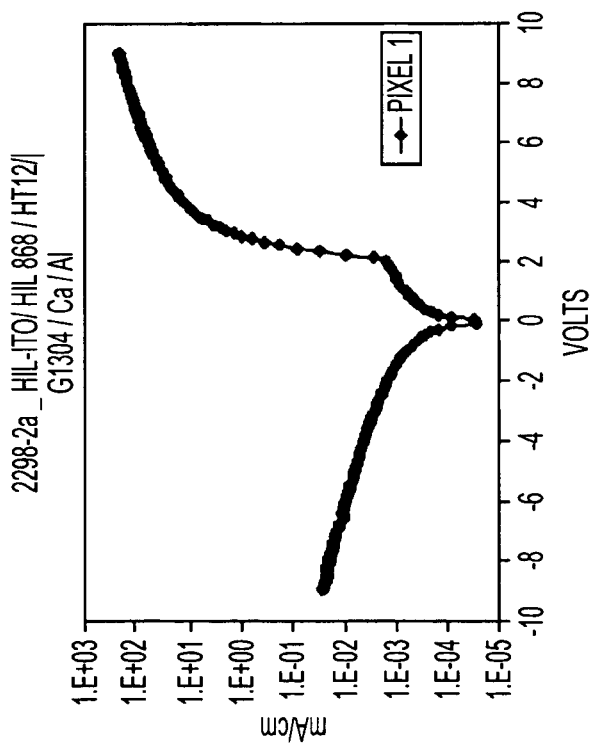

IVL testing was carried out, and the data are shown in FIGS. 3A and 3B.

Lifetime Testing

Figure 4:
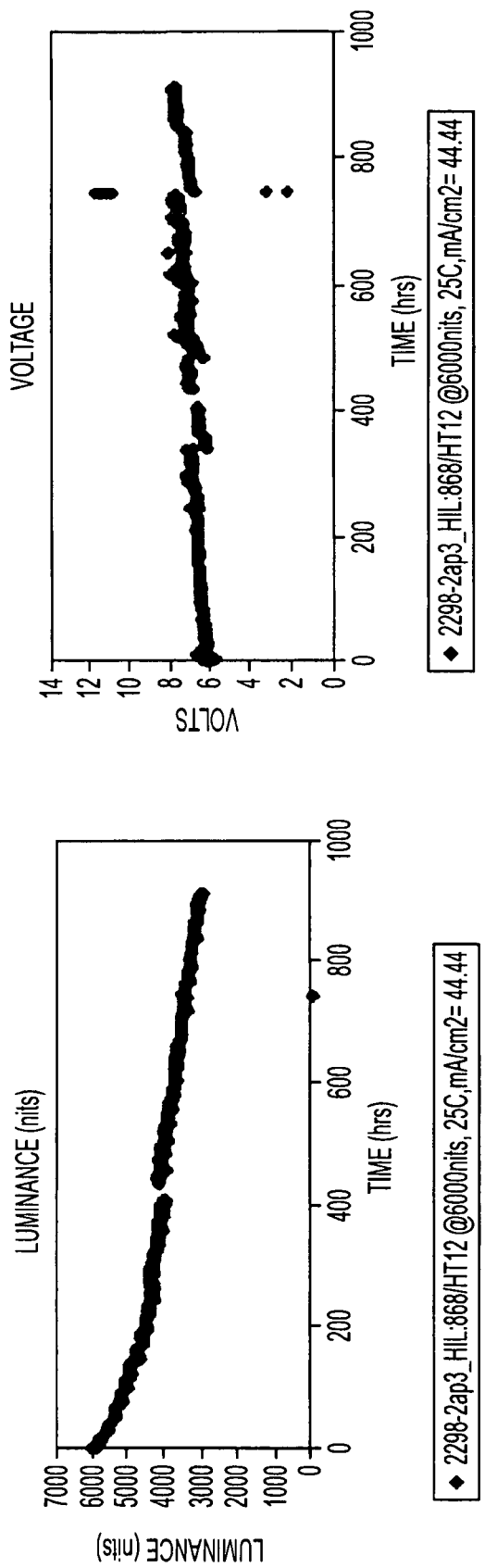
FIG. 4 shows lifetime testing for an OLED with a hole injection layer.

Once IVL Testing was completed, pixels were selected to be illuminated at a high brightness until the pixels reach one half of their initial luminance. The initial luminance was determined by sourcing current from the Keithley 2400 source meter directly to the pixel which was to be lifetime tested. The estimated amount of current to be sourced is determined from the IVL data. The initial luminance was measured using the PR-670 SpectraScan® Spectroradiometer. Once the desired luminance was achieved, the pixel was placed into a coupon holder which contained a photodiode that measures the luminance of the pixel over time. After the pixel had decayed to one half of its initial luminance, it was removed from lifetime. The data are shown in FIGS. 4A and 4B.

OPV Device Fabrication

As described above, compositions of the present invention may also be used as charge carrier transport layers in OPV devices. The following working examples provide a summary for at least an embodiment of the present invention.

Examples for P3MEETh-S+P4VPhOH-PFMO HILs with OPV Devices

Devices were made on indium tin oxide coated substrates (Thin Film Devices) which were cleaned in a Class 10,000 cleanroom by sonicating for 20 min in a soap solution, followed by 20 min of sonication in water, and 20 min of sonication in acetone. Finally the substrates were exposed to UV ozone (300 W) for 10 min. After cleaning, each substrate was then coated with a ~60 nm thick layer of HIL.

Two different hole injection materials were manufactured according to the formulations summarized in the following table:

| OPV-HIL-1 (Comparative) | | OPV-HIL-2 | |
| --- | --- | --- | --- |
| P3MEETh-S | 0.34 | P3MEETh-S | 0.30 |
| P4VPhOH | 1.58 | P4VPhOH-PFMO (15%) | 1.70 |
| PSS | 0.02 | Water | 63.70 |
| Nafion | 0.06 | Butyl Cellosolve | 34.30 |
| Water | 58.8 | | |
| Butyl Cellosolve | 39.2 | | |

Comparative example, OPV-HIL-1, was spun at 3000 rpm for 60 seconds while OPV-HIL-2, representative of a composition of one of the embodiments of the present invention, was spun at 1000 rpm for 60 seconds over the substrate, thereby forming HIL films. It is noted that for purposes of limiting confusion, the labels OPV-HIL-1 and OPV-HIL-2 in the table above extend to the films formed by the respective compositions. In other words, comparative composition OPV-HIL-1 forms HIL film OPV-HIL-1, while composition OPV-HIL-2 forms HIL film OPV-HIL-2. The HIL films were then annealed on a hot plate at 170° C. for 15 min in a $N_2$ atmosphere.

The substrates were then transferred to a dry-box for continued processing. AN active layer was then spin-coated on top of each of the HIL layer using one of the two ink formulations listed below for 200 seconds at 400 rpm in a nitrogen atmosphere. The devices were then annealed on a hot plate at 175° C. for 30 min in a nitrogen atmosphere. The PV inks used for this study were PV1000 and PV2000 (Plextronics, Inc).

OPV Device Testing

The photovoltaic characteristics of devices under white light exposure (Air Mass 1.5 Global Filter) were measured using a system equipped with a Keithley 2400 source meter and an Oriel 300 W Solar Simulator based on a Xe lamp with output intensity of 100 mW/cm2 (AM1.5G). The light intensity was set using an NREL-certified Si-KG5 silicon photodiode.

The power conversion efficiency of a solar cell is given as $\eta=(FF|Jsc|Voc)/Pin$, where FF is the fill factor, Jsc is the current density at short circuit, Voc is the photovoltage at open circuit and Pin is the incident light power density.

The resulting device performance for the aforementioned devices is shown in the table below.

| HIL | OPV ink | Jsc | Voc | FF | PCE |
| --- | --- | --- | --- | --- | --- |
| OPV-HIL-1 | PV1000 | 9.92 | 0.61 | 0.62 | 3.71 |
| (comparative) | PV2000 | 9.64 | 0.81 | 0.62 | 4.83 |
| OPV-HIL-2 | PV1000 | 8.65 | 0.6 | 0.63 | 3.25 |
| | PV2000 | 8.99 | 0.82 | 0.61 | 4.49 |

As shown in the table above, the device comprising the OPV-HIL-2 hole injection layer which was formed of an exemplary composition of the present invention, unexpectedly performed in a manner very similar to a comparative device comprising OPV-HIL-1 hole injection layer.

Section II. Hydrophobic Polymer Working Examples (Alkyl Modification)
Synthesis and Characterization of Polymers Synthesis of
poly(4-vinylphenol-co-hexyloxy-4-vinylbenzene)
(P4VPhOH-Hex)

A clean round bottom flask was charged with 71.2 g of poly(4-vinylphenol) with average $M_w$ of 8,000. Anhydrous dimethylformamide and potassium carbonate (65.5 g, 0.474 moles) were added. This was stirred at room temperature for 1 hour under a nitrogen blanket. Potassium iodide (1.12 g, 0.007 moles) and bromohexane (33.5 ml, 0.24 moles) were added all at once. The reaction was heated to 60° C. for 68 hours under a nitrogen blanket. The reaction was cooled to room temperature and then poured into 2 L of de-ionized water. The mixture was acidified with the drop-wise addition of concentrated HCl to form a tan tarry solid. The aqueous phase was decanted and discarded. The tar was taken up in 100 ml of hot methanol and dripped into 2 L of de-ionized water with vigorous stirring. The fine tan solid was isolated by centrifuging at 3400 rpm for 20 minutes and decanting the aqueous supernatant. The solids were washed by shaking with de-ionized water and centrifuging at 3400 rpm for 20 minutes. The solids were collected by filtration and dried in vacuum for 48 hours at 40-50° C. NMR indicated 27% of the phenols were alkylated.

The polymer formulations are summarized in the following table as HIL001-HIL005, each with varying levels of hexyl substitution.

| HIL | ICP | P4VPhOH-hexyl (xx %) | PSS | Nafion | Water | Butyl Cellosolve | % TS |
|---|---|---|---|---|---|---|---|
| HIL001 | 0.18 | 1.89 (0%) | 0.07 | 0.07 | 53.79 | 44.00 | 2.2 |
| HIL002 | 0.18 | 1.89 (14%) | 0.07 | 0.07 | 53.79 | 44.00 | 2.2 |
| HIL003 | 0.18 | 1.89 (22%) | 0.07 | 0.07 | 53.79 | 44.00 | 2.2 |
| HIL004 | 0.18 | 1.89 (26%) | 0.07 | 0.07 | 53.79 | 44.00 | 2.2 |
| HIL005 | 0.18 | 1.89 (10%) | 0.07 | 0.07 | 53.79 | 44.00 | 2.2 |

TS = total solids
Relative weights

HIL001 was prepared by dissolving 1.892 g of P4VPhOH in 44.01 g of butyl cellosolve. In a separate container, 0.66 g of Nafion solution (purchased from Sigma Aldrich), 0.367 g of PSS (polystyrene sulfonate, purchased from Sigma Aldrich) and 14.727 g of water were weighed and mixed together. 38.344 g of ICP dispersion (0.459% solids) was added into the second container and mixed well. The two solutions were then combined and mixed for about 30 minutes.

HIL002-HIL005 were prepared in an identical manner to HIL001 by replacing P4VPhOH with the modified versions of P4VPhOH.

Films were made with these HILs using spin coating process as follows: About 2 ml of the HIL solution were injected through a 0.45 mu PVDF membrane filter onto a UV/ozonized glass plate. The glass plate was spun initially at 350 rpm for 3 seconds and then 1600 rpm for 1 minute. The glass plate coated with HIL was then transferred to a 170° C. hot plate.

Characterization of the films was performed to discover if: 1. Hexyl-modified poly(4-vinylphenol) would impact the surface energy; 2. additives to the HIL formulation could result in changes to the surface energy of the film; and 3. to see if lowering the surface tension of the solvent used to measure contact angle could lower the contact angle. There were indications that the hexyl-modified poly(4-vinylphenol) gave a lower contact angle as well as the inclusion of some additives. Films were spun and contact angles measured with xylene and xylene with 10% 1,3(trifluoromethyl)benzene (TFMB) drops. Addition of TFMB slightly lowered the surface tension of xylene and gave a slightly lowered contact angle on the HIL films.

The effect of three levels of hexyl substitution was examined (0%, 14%, 22%, and 26%). The results indicated a lower contact angle on HILs prepared with higher amounts of hexyl substitution (average of several measurements).

| HIL | Anneal Condition | Contact Angle (with xylene) |
|---|---|---|
| HIL001 | 110° C./15 min | 48 |
| HIL001 | 170° C./15 min | 48 |
| HIL002 | 170° C./15 min | 46 |
| HIL003 | 170° C./15 min | 39 |
| HIL004 | 170° C./15 min | 34 |

Additionally, increased levels of hexyl substitution results in only a slight impact on efficiency and no impact on lifetime as shown in the following table:

| HIL | % hexyl substitution | V | Cd/A | lm/W | Lifetime (DC, 6000 nits) |
|---|---|---|---|---|---|
| HIL001 | 0 | 3.9 | 12.5 | 10.0 | 60 |
| HIL002 | 14 | 3.8 | 10.4 | 8.7 | n/a |
| HIL003 | 22 | 3.7 | 10.5 | 8.9 | 60 |
| HIL004 | 26 | 3.8 | 9.8 | 8.0 | 55 |

Sodium silicate solution was added to HIL 005 base formulation. Sodium silicate addition to the HIL (5 drops to 15 mL of HIL) results in a film that with a lower contact angle using xylene. Device data as collected (see table below) shows that efficiency (Cd/A) decreases with the addition of sodium silicate.

| HIL | $Na_2SiO_4$ | V | Cd/A | lm/W |
|---|---|---|---|---|
| HIL005 | N | 4.0 | 9.3 | 7.3 |
| HIL005 | Y | 3.9 | 6.7 | 5.4 |

III. Hydrophilic Sulfonate Polymer Working Examples
Synthesis and Characterization of Polymers Synthesis of poly(4-vinylphenol-co-styryloxy-co-ω-propanesulfonic acid) (P4VPhOH—$SO_3H$)

To a clean dry 1 L 3N RBF, cannulated 450 mL of anhydrous N,N-dimethyl formamide. Added 30 g of poly(4-vinylphenol), Mn=8000 and stirred to dissolve the polymer. To this solution added 17.28 g anhydrous potassium carbonate (0.5 eq based on moles of repeat unit). To this, stirred mixture added 7.66 g propane sulfone. Heat the reaction mixture to 50-60° C. overnight (about 14 h). Stopped heating and centrifuged the reaction mixture to remove the potassium carbonate residues. Concentrated the supernatant solution to 290 mL on a rotary evaporator and precipitated into 1500 mL of 75:25 (v/v) hexanes/chloroform (alternatively a mixture of acetone and hexanes can also be used). Filtered the precipitated polymer and washed it with 150 mL hexanes. Suction dried the polymer on the funnel until no more solvent comes out. Transferred the polymer to a 1 L 1N RBF and refluxed in 500 mL 3:7(v/v) chloroform: hexanes mixture for 15 min.

Checked for free polymer particles without agglomerates. Cooled the mixture to room temperature and filtered the solution. Nearly quantitative yields. Washed the polymer with 150 mL hexanes and dried in vacuo at room temperature for 48 h. The dried polymer was then dissolved in de-ionized water (enough to make about 5-7% by wt) with slight heating. The polymer solution was then passed through Amberlite IR 120 ($H^+$ form ion-exchange resin) to obtain the acid form of the polymer. Resulting polymer solution was acidic.

HIL formulations, numbered 1-8, were prepared as follows for further viscosity and surface tension testing:

| HIL | Planarizing Polymer | Viscosity, cp | Surface tension dyne/cm |
|---|---|---|---|
| 1 | P4VPhOH | 9.8 | 33 |
| 2 | P2E2O* | 6.7 | 61 |
| 3 | P4VPhOH | 14 | 60 |
| 4 | P4VPhOH-PrSO3H (15%) | 7.3 | 73 |
| 5 | P4VPhOH-PrSO$_3$H (15%) | 9.8 | 73 |
| 6 | P4VPhOH-PrSO$_3$H (15%) | 2.5 | 74 |
| 7 | P4VPhOH-PrSO$_3$H (15%) | 14.6 | 72 |
| 8 | P4VPhOH-PrSO$_3$Na (15%) | 11 | 73 |

*P2E2O is poly(2-ethyl-2-oxazoline) purchased from Sigma Aldrich.

With use of P4VPhOH, one may have difficulty if one uses just water or water and a high surface tension solvent to make the formulation. One may therefore have to use butyl cellosolve or the like which can dramatically lower the surface tension. With P4VPhOh-PrSO$_3$H, one can use water or water and high surface tension solvent such as glycerol.

To make 100 g of HIL 4 (formulation no. 4 in the above table), first weighed 30.7 g of glycerol into a glass bottle. Added 0.8 g of water into the same bottle and mixed the two solvents together by shaking the bottle several times. Then, added 0.6 g of 10% Nafion solution and 0.4 g of 18% PSS solution and shook the bottle several times to mix all the components. Add 38.7 g of 5% sulfonated poly(4-vinylphenol) solution and shook the bottle several times. Finally, added 28.8 g of ICP dispersion and shook the bottle several times. Added a magnetic stirring bar into the bottle and placed the bottle on a magnetic stirrer and stirred the HIL for about 30 minutes. Filtered the HIL through a 0.45 um PVDF disposable filter. Measured surface tension and viscosity within an hour and examined the viscosity sample holding pan for precipitation. Checked sample stability frequently and noted if any precipitation, black spots or phase separation occurred.
1. Surface tension was measured by a SensaDyne Model PC500-L tensiometer.
2. Viscosity was measured by a Brookfield DV-II Pro viscometer.
3. Ink jet printability was measured by a Dimatix DMP-2800 ink jet printer.

Ink jetting of higher surface tension HILs prevents the HIL ink from overflowing the pixel banks causing defects and poor film formation.

| HIL | ICP | PA | PSS | Nafion | Water | Glycerol | | Surface Tension | Viscosity | Jetting? |
|---|---|---|---|---|---|---|---|---|---|---|
| Poly(4-vinylphenol) with 28% sulfonation | | | | | | | | | | |
| 1 | 0.13 | 1.94 | 0.07 | 0.07 | 66.4 | 31.3 | | 68 | 6.5 | Y |
| Poly(4-vinylphenol) with 15% sulfonation | | | | | | | | | | |
| | | | | | | Ethylene Glycol | | | | |
| 2 | 0.11 | 1.58 | 0.05 | 0.05 | 64.01 | 34.2 | | 73 | 7.3 | Good |
| 3 | 0.11 | 1.58 | 0.05 | 0.05 | 60.11 | 38.1 | | 73 | 9.8 | |
| 4 | 0.11 | 1.58 | 0.05 | 0.05 | 60.11 | | 38.1 | | | |
| 5 | 0.11 | 1.58 | 0.05 | 0.5 | 97.76 | | | 74 | 2.5 | |
| Poly(4-vinylphenol) with 10.5% sulfonation | | | | | | | | | | |
| | | | | | | IPA | | | | |
| 6 | 0.13 | 1.94 | 0.07 | 0.07 | 55.74 | 42.05 | | 68 | 10.9 | Good |
| Poly(4-vinylphenol) with 8.5% sulfonation | | | | | | | | | | |
| | | | | | | 1,3-propanediol | | | | |
| 9 | 0.13 | 1.94 | 0.07 | 0.07 | 55.74 | 42.05 | | 73 | 12.6 | Good |
| 10 | 0.3 | 1.7 | | | 79.38 | 18.62 | | 75 | 19.7 | |
| 11 | 0.27 | 1.53 | | | 88.38 | 9.82 | | 75 | 13.3 | |
| 12 | 0.27 | 1.53 | | | 88.38 | 4.91 | 4.91 | 71 | 20.6 | |
| 13 | 0.18 | 1.62 | | | 93.29 | | 4.91 | 70 | 5.3 | |
| 14 | 0.18 | 1.62 | | | 63.83 | 29.46 | 4.91 | 70 | 11.6 | Good |

IV. Alkyleneoxy Working Examples
Synthesis of Diethylene Glycol, Monotosylate

Figure 5:
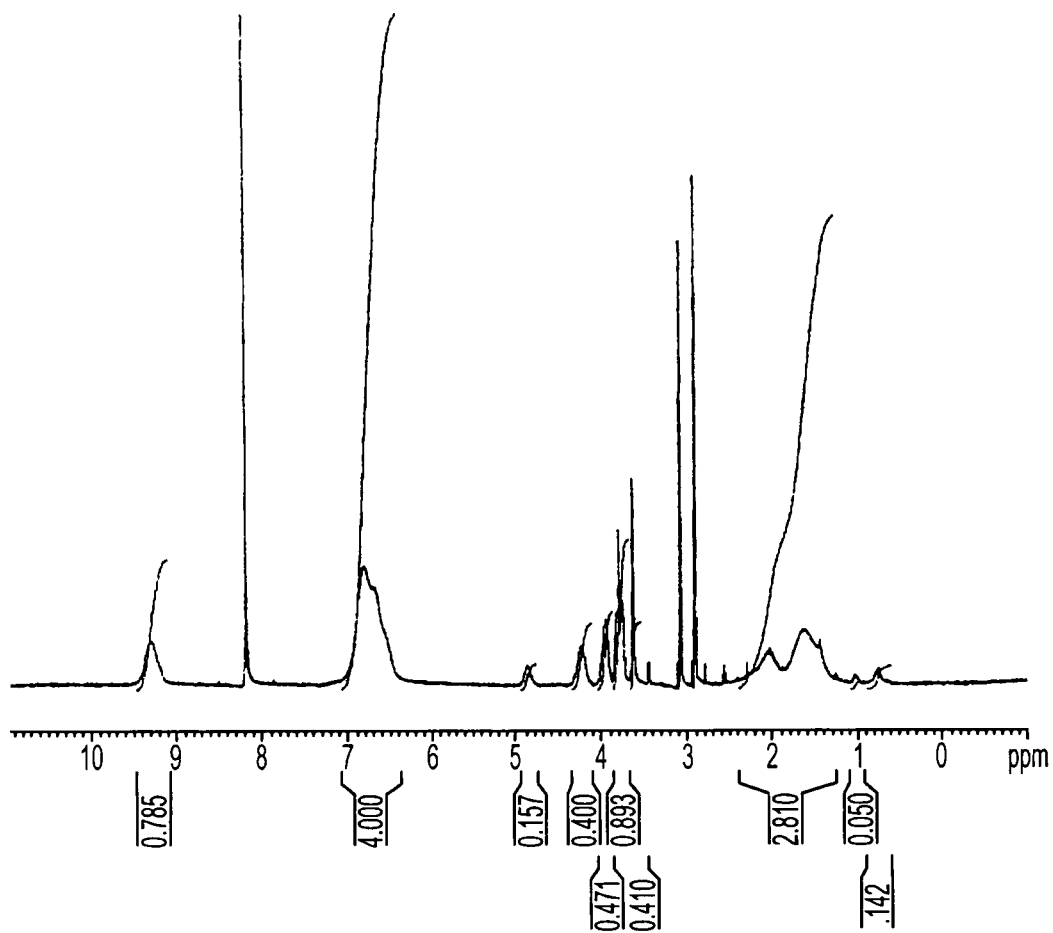
FIG. 5 illustrates $^1$H-NMR spectrum of diethylene glycol, monotosylate.

To a clean dry 500 mL 1 N RBF added 35 g diethylene glycol followed by 53 mL of pyridine. Cooled solution to 0-5° C. in an ice-bath and added 31.5 g of p-toluene sulfonylchloride portionwise over 5 min. Removed ice-bath, allowed solution to attain room temperature and continued reaction overnight. Solution initially became cloudy and then clear during the reaction. Added the reaction mixture to 550 mL of de-ionized water and stirred for 1 h. Filtered off the white solids which was found to be the ditosylate. The filtrate was neutralized with concentrated hydrochloric acid (about 60 mL) and extracted into 2×250 mL tert-butylmethyl ether. The ethereal layer was further washed with 2×200 mL saturated sodium bicarbonate solution and 1×200 mL water. Dried the ether layer over anhydrous $MgSO_4$, filtered and concentrated to dryness on a rotary evaporator. If there is any excess pyridine repeat above washes with 1 N HCl and then water. Obtained the monotosylate as a clear viscous liquid (10 g). TLC and $^1$H NMR (FIG. 5) indicates clean compound which was used without additional purification for further reactions.

Synthesis of poly(4-vinylphenol-co-hydroxyethoxy-ethoxy-4-vinylbenzene) (P4VPhOH-EEOH)

Figure 6:
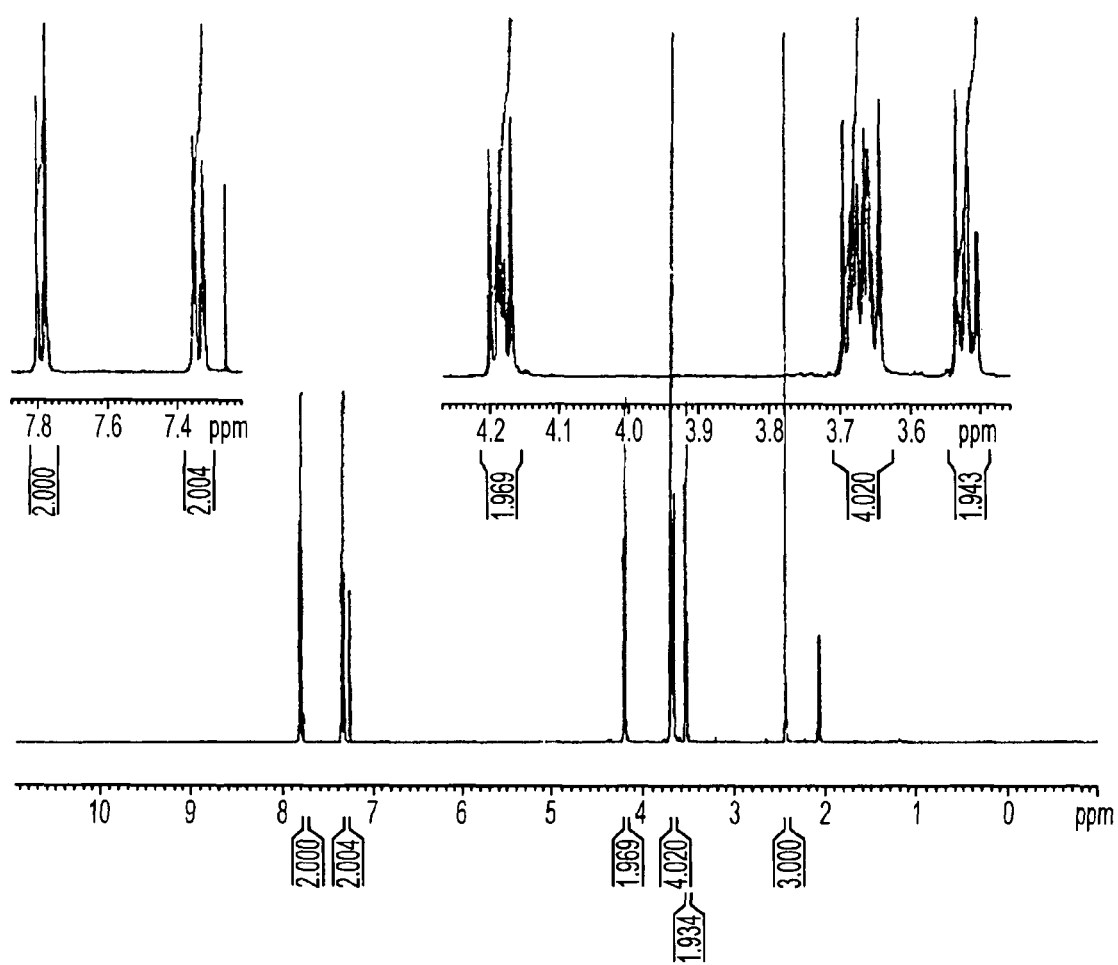
FIG. 6 illustrates $^1$H-NMR spectrum of P4VPhOH-EEOH.

To a clean dry 250 mL 2N RBF, added 2.2 g poly(4-vinylphenol) followed by cannulation of 280 mL of anhydrous N,N-dimethyl formamide, and stirred to dissolve the polymer. To this solution added 0.46 g Sodium hydride powder in one portion (1.05 eq based on moles of repeat unit) and stirred at room temperature for 1 h. To this suspension added 5.8 g diethylene glycol monotosylate dissolved in 10 mL anhydrous DMF. Heated the RM to 60-65° C. for 56 h. After cooling the solution precipitate in 2 lots into 600 mL (4:1 v/v) hexanes-chloroform mixture. Filtered the solids and washed with hexanes. The gummy solid was dissolved in 40 mL isopropanol and diluted with 40 mL methanol acidified with 2 mL conc. HCl. The polymer was precipitated into 250 mL water, filtered and washed with water. The polymer was subsequently dried in vacuo at RT. $^1$H-NMR indicated about 20% substitution. Alternatively, the sodium hydride can be replaced with anhydrous potassium carbonate to de-protonate the phenol. The $^1$H NMR data are shown in FIG. 6. Higher percentages of the ethylene glycol has been obtained by repeating the above reaction on the partially substituted poly (4-vinylphenol).

Additional formulations, devices, and test results are provided in the following table:

TABLE 1a

Formulations - poly(4-vinylphenol) - modified with PFMO

| Formulation | %-Mod | ICP | PVP-Mod | PSS | Nafion | Water | Butyl Cellosolve | IPA | 1,2-propanediol |
|---|---|---|---|---|---|---|---|---|---|
| 1-1 | 15 | 0.2 | 1.8 | | | 63.7 | 34.3 | | |
| 1-2 | 15 | 0.18 | 1.51 | 0.05 | 0.05 | 24.45 | | 34.2 | 39.12 |
| 1-3 | 15 | 0.2 | 1.8 | | | 63.7 | 34.3 | | |
| 1-4 | 15 | 0.13 | 2 | 0.07 | | 53.79 | 44.01 | | |
| 1-5 | 5 | 0.2 | 1.8 | | | 63.7 | 34.3 | | |
| 1-6 | 5 | 0.13 | 2 | 0.07 | | 53.79 | 44.01 | | |

TABLE 1b

Test Results - poly(4-vinylphenol) - modified with PFMO

| Formulation | Emitter | V | Cd/A | lm/W | Lifetime | Testing condition | Control if available |
|---|---|---|---|---|---|---|---|
| 1-1 | 1 | 4.29 | 10.80 | 7.91 | 24 | 6000 nits DC, rt | 17 PEDOT |
| 1-1 | 2 | 3.55 | 13.68 | 12.12 | 911 | 6000 nits DC, rt | 234 PEDOT |
| 1-1 | 2 | 3.91 | 12.55 | 10.12 | 265 | 6000 nits DC, rt | 168 PEDOT |
| 1-2 | 2 | 3.45 | 13.52 | 12.3 | | | |
| 1-3 | 2 | 3.3 | 11.08 | 10.56 | 190 | 6000 nits DC, rt | 189 PEDOT |
| 1-4 | 2 | 3.41 | 11.88 | 10.96 | 93 | 6000 nits DC, rt | |
| 1-5 | 2 | 3.63 | 9.45 | 8.21 | 169 | 6000 nits DC, rt | |
| 1-6 | 2 | 3.63 | 11.12 | 9.65 | 238 | 6000 nits DC, rt | |

Emitter 1 is a commercial emitter
Emitter 2 is a commercial emitter with an interlayer
Emitter 3 is a commercial emitter TABLE 2a Formulations - poly(4-vinylphenol) - modified with EEOH

| Formulation | %-Mod | ICP | PVP-Mod | PSS | Nafion | Water | Butyl Cellosolve | Dowanol PM |
|---|---|---|---|---|---|---|---|---|
| 2-1 | 10 | 0.3 | 1.7 | | | 58.8 | | 39.2 |
| 2-2 | 20 | 0.2 | 1.69 | 0.1 | 0.01 | 61.7 | 36.3 | |
| 2-3 | 20 | 0.2 | 1.79 | | 0.01 | 61.74 | 36.26 | |
| 2-4 | 20 | 0.3 | 1.7 | | | 58.8 | | 39.2 |

TABLE 2a-continued

Formulations - poly(4-vinylphenol) - modified with EEOH

| Formulation | %-Mod | ICP | PVP-Mod | PSS | Nafion | Water | Butyl Cellosolve | Dowanol PM |
|---|---|---|---|---|---|---|---|---|
| 2-5 | 10 | 0.06 | 1.94 | | | 58.8 | | 39.2 |
| 2-6 | 10 | 0.08 | 1.92 | | | 58.8 | | 39.2 |
| 2-7 | 10 | 0.1 | 1.9 | | | 58.8 | | 39.2 |
| 2-8 | 45 | 0.2 | 1.8 | | | 39.2 | | 58.8 |
| 2-9 | 45 | 0.2 | 1.8 | | | 39.2 | 58.8 | |
| 2-10 | 60 | 0.2 | 1.8 | | | 39.2 | 58.8 | |

TABLE 2b

Test Results - poly(4-vinylphenol) - modified with EEOH

| Formulation | Emitter | V | Cd/A | lm/W | Lifetime | Testing condition | Control if available |
|---|---|---|---|---|---|---|---|
| 2-1 | 2 | 3.88 | 12.08 | 9.92 | 2547 | MUX 64, 400 nits, 70 C. | 800 PEDOT |
| 2-1 | 1 | 4.22 | 10.07 | 7.51 | 885 | MUX 64, 600 nits, 70 C. | |
| 2-1 | 2 | 4.13 | 9.11 | 6.99 | 243 | MUX 64, 600 nits, 70 C. | |
| 2-1 | | | | | 2444 | MUX 64, 400 nits, rt | |
| 2-2 | 2 | 3.74 | 15.49 | 13.01 | 840 | MUX 64, 600 nits, 70 C. | |
| 2-3 | 2 | 3.49 | 14.07 | 12.68 | 741 | MUX 64, 600 nits, 70 C. | |
| 2-4 | 2 | 4.22 | 12.37 | 9.22 | | | |
| 2-5 | 1 | 5.51 | 8.69 | 4.97 | | | |
| 2-5 | 2 | 4.87 | 8.2 | 5.33 | | | |
| 2-6 | 1 | 5.4 | 9.56 | 5.6 | | | |
| 2-6 | 2 | 4.65 | 9.42 | 6.36 | | | |
| 2-7 | 1 | 5.3 | 10.73 | 6.37 | | | |
| 2-7 | 2 | 4.6 | 10.1 | 6.93 | | | |
| 2-8 | 1 | 4.77 | 7.59 | 5 | | | |
| 2-9 | 2 | 4.36 | 7.81 | 5.63 | | | |
| 2-10 | 2 | 4.57 | 5.8 | 3.99 | | | |

Emitter 1 is a commercial emitter
Emitter 2 is a commercial emitter with an interlayer
Emitter 3 is a commercial emitter TABLE 3a Formulations - poly(4-vinylphenol) - modified with SO3H

| Formulation | %-Mod | ICP | PVP-Mod | PSS | Nafion | Water | Butyl Cellosolve |
|---|---|---|---|---|---|---|---|
| 3-1 | 10 | 0.12 | 1.26 | | | 35.8 | 62.8 |
| 3-2 | 10 | 0.12 | 1.26 | | | 98.62 | |
| 3-3 | 10 | 0.3 | 1.7 | | | 98 | |
| 3-4 | 10 | 0.12 | 1.88 | | | 43.7 | 54.3 |
| 3-5 | 10 | 0.19 | 2.96 | | | 96.85 | |
| 3-6 | 10 | 0.32 | 2.8 | | 0.03 | 96.85 | |
| 3-7 | 10 | 0.32 | 2.68 | | 0.16 | 96.85 | |
| 3-8 | 30 | 0.13 | 1.98 | 0.08 | 0.01 | 46 | 51.8 |
| 3-9 | 15 | 0.13 | 1.98 | 0.08 | 0.01 | 46 | 51.8 |
| 3-10 | 30 | 0.13 | 1.98 | 0.08 | 0.01 | 97.8 | |
| 3-11 | 15 | 0.13 | 1.98 | 0.08 | 0.01 | 97.8 | |

TABLE 3b

Test Results - poly(4-vinylphenol) - modified with SO3H

| Formulation | Emitter | V | Cd/A | lm/W | Lifetime | Testing condition | Control if available |
|---|---|---|---|---|---|---|---|
| 3-1 | | | | | | | |
| 3-2 | | | | | | | |
| 3-3 | | | | | | | |
| 3-4 | 1 | 6.03 | 8.37 | 4.41 | 17 | DC, 6000 nits, 75 C. | |
| 3-4 | 3 | 6.38 | 5.05 | 2.49 | | | |
| 3-4 | 3 | 4.96 | 6.99 | 4.42 | | | |
| 3-5 | 1 | 6.24 | 10.61 | 5.34 | | | |
| 3-5 | 3 | 5.14 | 4.45 | 2.72 | | | |
| 3-5 | 2 | 4.91 | 10.62 | 6.82 | | | |
| 3-5 | 1 | 5.98 | 6.59 | 3.46 | | | |
| 3-6 | 1 | 5.54 | 7.83 | 4.44 | | | |
| 3-6 | 3 | 4.82 | 5.48 | 3.57 | 100 | MUX 64, 400 nits, 70 C. | |
| 3-6 | 2 | 3.93 | 12.82 | 10.25 | | | |
| 3-7 | 1 | 5.02 | 7.77 | 4.87 | | | |
| 3-7 | 3 | 5.41 | 10.37 | 6.12 | 16 | MUX 64, 400 nits, 70 C. | |
| 3-7 | 2 | 3.95 | 14.01 | 11.19 | | | |

TABLE 3b-continued

Test Results - poly(4-vinylphenol) - modified with SO3H

| Formulation | Emitter | V | Cd/A | lm/W | Lifetime | Testing condition | Control if available |
|---|---|---|---|---|---|---|---|
| 3-8 | | | | | | | |
| 3-9 | | | | | | | |
| 3-10 | | | | | | | |
| 3-11 | | | | | | | |

Emitter 1 is a commercial emitter
Emitter 2 is a commercial emitter with an interlayer
Emitter 3 is a commercial emitter

TABLE 4

"CONTROLS"

| HIL | Emitter | Exp | V | Cd/A | lm/W | Lifetime | Testing Condition |
|---|---|---|---|---|---|---|---|
| CH8000 | 1 | 2250 | 3.89 | 9.29 | 7.51 | 227 | 6000 nits DC, rt |
| CH8000 | 2 | 2298 | 3.64 | 12.23 | 10.5 | 215 | 6000 nits DC, rt |

Emitter 1 is a commercial emitter
Emitter 2 is a commercial emitter with an interlayer
Emitter 3 is a commercial emitter

What is claimed is:

1. A composition for use as a hole injection layer or hole transport layer comprising:
at least one conjugated polymer, wherein the conjugated polymer is a polythionhene,
at least one second polymer having a glass transition temperature of at least about 25° C. and consisting essentially of repeat units represented by:
(I) —[CH$_2$—CH(Ph-OH)]— and
(II) —[CH$_2$—CH(Ph-OR)]—
wherein Ph is a phenyl ring and R comprises an alkyl group, wherein the alkyl group has 2 to 20 carbon atoms, and wherein the molar amount of repeat unit (I) is greater than the molar amount of repeat unit (II) and wherein the weight percentage of the second polymer is at least three times as much as the weight percentage of the first polymer.

2. The composition of claim 1, wherein the conjugated polymer is a regioregular polythiophene.

3. The composition of claim 1, wherein the weight percentage of the second polymer is at least six times as much as the weight percentage of the first polymer.

4. The composition of claim 1, wherein the composition further comprises at least one third polymer.

5. The composition of claim 1, wherein the composition further comprises at least one third polymer which is an ionic polymer.

6. The composition of claim 1, wherein the composition further comprises at least one third polymer which is an ionic fluorinated polymer.

7. The composition of claim 1, wherein the composition further comprises at least one third polymer which is present in a weight percentage amount which is less than the weight percentage of the conjugated polymer.

8. The composition of claim 1, further comprising a solvent carrier.

9. The composition of claim 1, further comprising a solvent carrier comprising water and at least one second solvent, wherein the composition is an aqueous formulation.

10. The composition of claim 1, wherein the conjugated polymer and the second polymer are soluble.

11. The composition of claim 1, wherein the molar amount of repeat unit (I) is at least twice the molar amount of repeat unit (II).

12. The composition of claim 1, wherein the molar amount of repeat unit (I) is at least three times the molar amount of repeat unit (II).

13. The composition of claim 1, wherein the conjugated polymer is a self-doped conjugated polymer.

14. The composition of claim 1, wherein the conjugated polymer is a doped polymer.

15. The composition of claim 1, wherein the conjugated polymer is a sulfonated polymer.

16. The composition of claim 1, wherein the conjugated polymer is a sulfonated polythiophene.

17. The composition of claim 1, wherein the conjugated polymer is a sulfonated polythiophene and wherein the conjugated polymer and the second polymer are soluble, and wherein the Ph is substituted by —OH and —OR at the 4-position.

18. The composition of claim 1, wherein R decreases contact angle for xylene relative to the control polymer —[CH$_2$—CH-Ph-OH]$_n$—.

19. The composition of claim 1, wherein R decreases contact angle at least 10 degrees for xylene relative to the control polymer —[CH$_2$—CH-Ph-OH]$_n$—.

20. The composition of claim 1, wherein R decreases contact angle at least 20 degrees for xylene relative to the control polymer —[CH$_2$—CH-Ph-OH]$_n$—.

21. The composition of claim 1, wherein the conjugate polymer and the second polymer make up more than 66.7% weight percentage of the composition.

22. The composition of claim 8, wherein the composition has a viscosity of about 1 cP to about 40 cP.

23. The composition of claim 8, wherein the composition has a surface tension of about 30 dyne/cm to about 70 dyne/cm.

24. The composition of claim 1, wherein the glass transition temperature is at least 100° C.

25. A method of formulating a composition for use as an ink for a hole injection layer or a hole transport layer comprising:
providing at least one conjugated polymer, wherein the conjugated polymer is a polvthiophene;
providing at least one second polymer having a glass transition temperature of at least about 25° C. and consisting essentially of repeat units represented by:
(I) —[CH$_2$—CH(Ph-OH)]— and
(II) —[CH$_2$—CH(Ph-OR)]—
wherein Ph is a phenyl ring and R comprises, an alkyl group, wherein the the alkyl group has 1 to 25 carbon atoms, and wherein the molar amount of repeat unit (I) is greater than the molar amount of repeat unit (II) and providing at least one solvent;

mixing the conjugated polymer and the second polymer and the solvent to form an ink, wherein the weight percentage of the second polymer is more than the weight percentage of the first polymer.

26. The method of claim 25, wherein the composition has a viscosity of about 1 cP to about 40 cP.

27. The method of claim 25, wherein the composition has a surface tension of about 30 dyne/cm to about 70 dyne/cm.

28. The method of claim 25, wherein the glass transition temperature is at least 100° C.

29. A device comprising a composition according to claim 1.

30. The device of claim 29, wherein the device is an OLED, PLED, SMOLED, or OPV device.

\* \* \* \* \*